United States Patent
Kang

(10) Patent No.: US 7,057,970 B2
(45) Date of Patent: Jun. 6, 2006

(54) NONVOLATILE FERROELECTRIC MEMORY AND CONTROL DEVICE USING THE SAME

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 127 days.

(21) Appl. No.: 10/734,313

(22) Filed: Dec. 15, 2003

(65) Prior Publication Data

US 2004/0223402 A1    Nov. 11, 2004

(30) Foreign Application Priority Data

May 9, 2003    (KR)    ............... 10-2003-0029375

(51) Int. Cl.
  *G11C 8/18*    (2006.01)
  *G11C 8/12*    (2006.01)
  *G11C 8/06*    (2006.01)
(52) U.S. Cl. ............... 365/238.5; 365/145; 365/230.03; 365/233.5; 711/209
(58) Field of Classification Search ............... 365/145, 365/230.03, 185.11, 238.5, 233.5; 711/117, 711/209
See application file for complete search history.

(56) References Cited

U.S. PATENT DOCUMENTS

| | | | | |
|---|---|---|---|---|
| 4,195,238 A * | 3/1980 | Sato | ............................ | 326/87 |
| 5,991,223 A * | 11/1999 | Kozaru et al. | ......... | 365/230.03 |
| 6,067,244 A | 5/2000 | Ma et al. | | |
| 6,141,287 A * | 10/2000 | Mattausch | ............. | 365/230.03 |
| 6,272,594 B1 | 8/2001 | Gupta et al. | | |
| 6,301,145 B1 | 10/2001 | Nishihara | | |
| 6,314,016 B1 | 11/2001 | Takasu | | |
| 6,363,439 B1 | 3/2002 | Battles et al. | | |
| 2002/0054523 A1* | 5/2002 | Mizugaki et al. | ........... | 365/200 |

FOREIGN PATENT DOCUMENTS

KR    1020040059009 A    7/2004

* cited by examiner

Primary Examiner—Richard Elms
Assistant Examiner—J. H. Hur
(74) Attorney, Agent, or Firm—Heller Ehrman LLP

(57) ABSTRACT

A nonvolatile ferroelectric memory immediately outputs data stored in a page buffer without performing a cell access operation when a page buffer is accessed. Since a block page address region and a column page address region are arranged in less significant bit region, and a row address region is arranged in more significant bit region, the cell operation is not performed in the access of the page address buffer, thereby improving reliability of the cell and reducing power consumption.

8 Claims, 33 Drawing Sheets

NONVOLATILE FERROELECTRIC MEMORY AND CONTROL DEVICE USING THE SAME

BACKGROUND OF THE INVENTION

1. Field of the Invention

The present invention generally relates to a nonvolatile ferroelectric memory and a control device using the same, and more specifically, to a technology wherein data stored in a page address buffer are immediately outputted without accessing a memory cell in page address access operation.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

The access operation of the conventional nonvolatile ferroelectric memory is controlled by the configuration of FIG. 1.

The conventional nonvolatile ferroelectric memory control device comprises a chip enable signal buffer 1, an address buffer 2, a decoder 3, a chip enable signal transition detector 4, an address transition detector 5, a synthesizer 6 and a chip control signal generator 7.

The chip enable signal buffer 1 buffers a chip enable signal CEB_PAD inputted from a pad, and outputs a chip enable signal CEB. The address buffer 2 buffers addresses ADD_PAD<m:0> inputted from the pad in response to the chip enable signal CEB, and outputs the buffered addresses. The decoder 3 decodes the addresses buffered in the address buffer 2.

The chip enable signal transition detector 4 detects transition of the chip enable signal CEB, and outputs a chip enable transition detecting signal CTD. The address transition detector 5 detects transition of the addresses buffered in the address buffer 2, and outputs address transition detecting signals ATD<m:0>.

The synthesizer 6 synthesizes the chip enable transition detecting signal CTD and the address transition detecting signal ATD, and outputs a transition synthesizing signal ATD_S. The chip control signal generator 7 selectively generates chip control signals for driving a memory chip as the chip enable signal CEB and the transition synthesizing signal ATD_S applied from the synthesizer 6.

However, the conventional nonvolatile ferroelectric memory device whose operation is controlled by the control signals requires more improved reliability when it is used in a SOC (System On Chip) structure or a stand-alone structure.

If a voltage is frequently applied to a FeRAM cell, the cell also frequently operates. As a result, power consumption increases, thereby degrading reliability.

Since the conventional nonvolatile ferroelectric memory control device comprises row addresses and column addresses arranged at random, power is consumed unnecessarily when the FeRAM cell is driven. Thus, the unnecessary operation of the memory cell applies excessive stress to the cell, which results in reduction of life span of the cell.

SUMMARY OF THE INVENTION

Accordingly, it is an object of the present invention to provide a nonvolatile ferroelectric memory device which can output data stored in a page buffer immediately without performing a cell access operation in an access of the page buffer.

In an embodiment, a nonvolatile ferroelectric memory control device comprises a page address buffer, a row address latch unit, an address transition detector and a chip control signal generator. The page address buffer latches a page address having a block page address region and a column page address region in response to a chip enable signal, and decodes the latched page address. The row address latch unit latches a row address in response to the chip enable signal, and outputs the latched row address. The address transition detector detects transition of the latched row address, and outputs an address transition detecting signal. The chip control signal generator selectively generates a control signal to control a chip operation in response to the address transition detecting signal.

In another embodiment, a nonvolatile ferroelectric memory control device comprises a page address buffer, a row address latch unit, an address transition detector, a reset signal transition detector, a write enable signal transition detector, a synthesizer and a chip control signal generator. The page address buffer latches a page address having a block page address region and a column page address region in response to a chip enable signal, and decodes the latched page address. The row address latch unit latches a row address in response to the chip enable signal, and outputs the latched row address. The address transition detector detects transition of the latched row address, and outputs an address transition detecting signal. The reset signal transition detector detects transition of a reset signal in response to the chip enable signal, and outputs a reset transition detecting signal. The write enable signal transition detector detects transition of a write enable signal in response to the chip enable signal, and outputs a write enable transition detecting signal. The synthesizer outputs a transition synthesizing signal in response to the address transition detecting signal, the reset transition detecting signal and the write enable transition detecting signal. The chip control signal generator selectively generates a control signal to control a chip operation in response to the transition synthesizing signal.

In an embodiment, a nonvolatile ferroelectric memory comprises a plurality of unit blocks. Here, each unit block comprises a plurality of cell arrays, a plurality of row decoders and a plurality of column pages, and the plurality of column pages in one unit block constitute a unit block page to be activated simultaneously.

In another embodiment, a nonvolatile ferroelectric memory comprises a plurality of unit blocks, a common data bus unit, a unit block page and a data bus unit. Here, each unit block comprises a plurality of cell arrays. The common data bus unit exchanges input/output data with the plurality of unit blocks. The unit block page comprises a plurality of column pages. The data bus unit exchanges input/output data with the unit block page. The plurality of column pages in the unit block page are activated simultaneously.

In still another embodiment, a nonvolatile ferroelectric memory comprises a page address latch, a row address latch unit, an address transition detector, a chip control generator and a plurality of unit blocks. The page address latch latches a page address in response to a chip enable signal. The row address latch unit latches a row address in response to the chip enable signal, and outputs the latched row address. The address transition detector detects transition of the latched row address, and outputs an address transition detecting signal. The chip control generator selectively generates a control signal to control a chip operation in response to the address transition detecting signal. Each unit block comprises a plurality of cell arrays, a plurality of row decoders and a plurality of column pages. The plurality of column pages in one unit block constitute a unit block page to be activated simultaneously.

In still another embodiment, a nonvolatile ferroelectric memory comprises a page address latch, a row address latch unit, an address transition detector, a chip control signal generator, a plurality of unit blocks, a common data bus unit, a unit block page and a data bus unit. The page address latch latches a page address in response to a chip enable signal. The row address latch unit latches a row address in response to the chip enable signal, and outputs the latched row address. The address transition detector detects transition of the latched row address, and outputs an address transition detecting signal. The chip control signal generator selectively generates a control signal to control a chip operation in response to the address transition detecting signal. The plurality of unit blocks comprises a plurality of cell arrays. The common data bus unit exchanges input/output data with the plurality of unit blocks. The unit block page comprises a plurality of column pages. The data bus unit exchanges input/output data with the unit block page. The plurality of column pages in the unit block page are activated simultaneously.

DETAILED DESCRIPTION OF THE PREFERRED EMBODIMENTS

The present invention will be described in detail with reference to the accompanying drawings.

Figure 1:
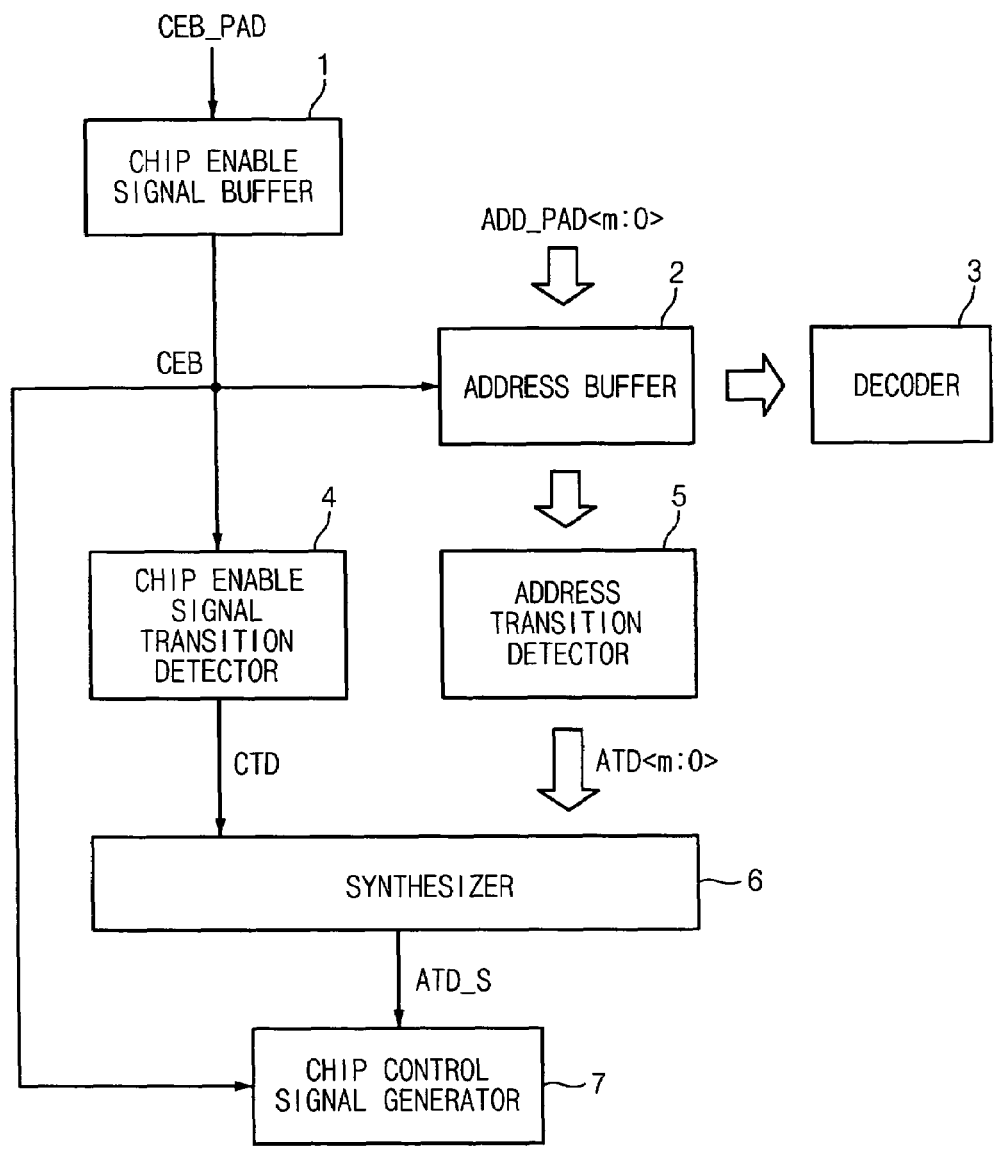
FIG. 1 is a diagram of a conventional nonvolatile ferroelectric memory control device.
Figure 2:
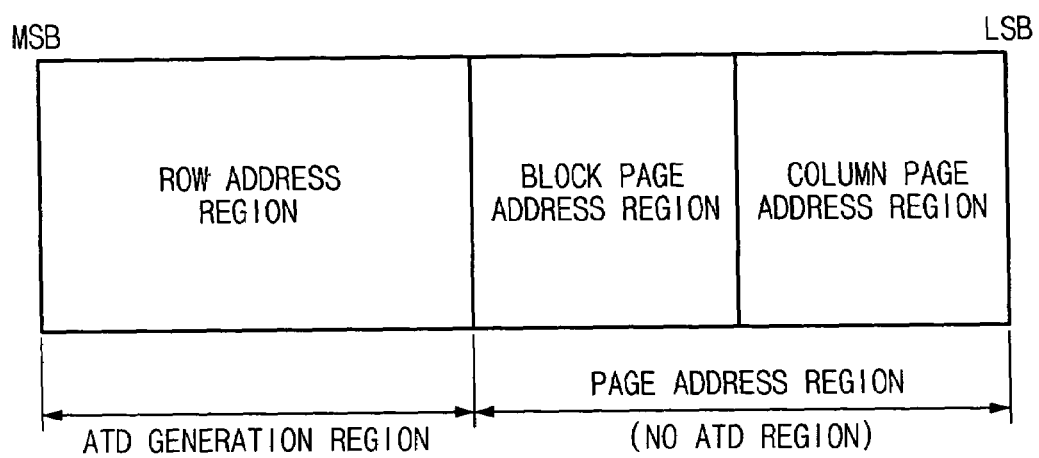
FIG. 2 is a diagram illustrating the address region assignment setting of a nonvolatile ferroelectric memory device according to an embodiment of the present invention.

FIG. 2 is a diagram illustrating the address region assignment setting of a nonvolatile ferroelectric memory device according to an embodiment of the present invention.

Since addresses adjacent to least significant bits in a process of driving a memory are generally accessed, a page address region is located in the LSB (Least Significant Bit) region according to an embodiment of the present invention. The process prevents an address transition detecting signal ATD from being generated in the page address region (No ATD region). If a page address is accessed in the same row address, data stored in a sense amplifier of a page address buffer are immediately outputted without driving of a FeRAM cell.

However, a row address region which is hardly accessed is located in a MSB (Most significant Bit) region. Whenever a row address is changed, the address transition detecting signal ATD is generated, thereby driving the FeRAM cell.

Here, the page address region is divided into a column page address region and a block page address region. Here, the column page address region is assigned adjacent to the LSB region, and the block page address region is arranged between the row address region and the column page address region.

Figure 3:
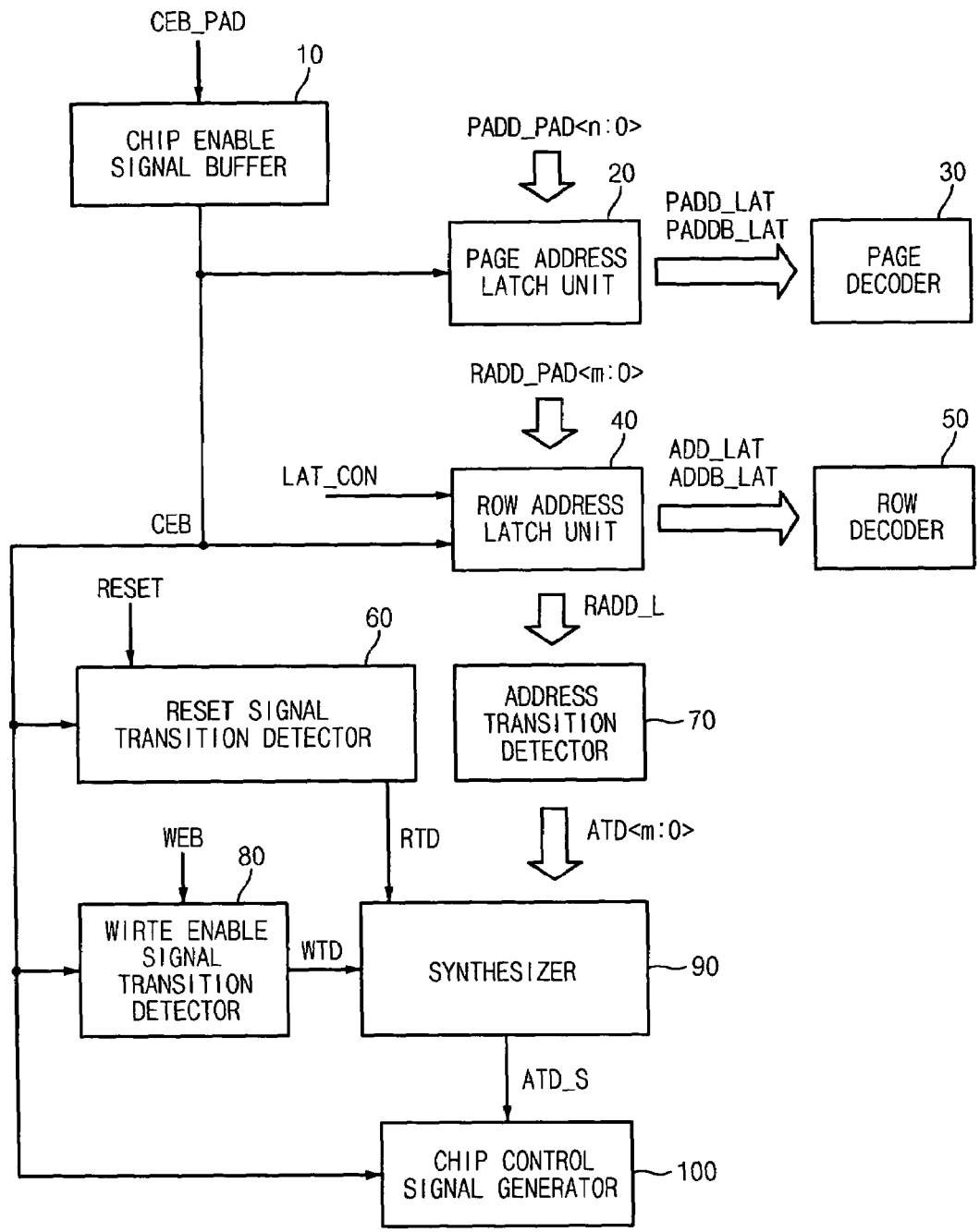
FIG. 3 is a structural diagram of a nonvolatile ferroelectric memory control device according to an embodiment of the present invention.

FIG. 3 is a structural diagram of a nonvolatile ferroelectric memory control device according to an embodiment of the present invention.

In an embodiment, the nonvolatile ferroelectric memory control device comprises a chip enable signal buffer 10, a page address latch unit 20, a page decoder 30, a row address latch unit 40, a row decoder 50, a reset signal transition detector 60, an address transition detector 70, a write enable signal transition detector 80, a synthesizer 90 and a chip control signal generator 100.

The chip enable signal buffer 10 buffers a chip enable signal CEB_PAD inputted from a pad, and outputs a chip enable signal CEB.

The page address latch unit 20 latches a page address PADD_PAD<n:0> inputted from the pad in response to the chip enable signal CEB, and outputs the latched page addresses PADD_LAT and PADDB_LAT. The page decoder 30 decodes the latched page address PADD_LAT and PADDB_LAT. Here, the page address latch unit 20 and the page decoder 30 operate as a page address buffer.

The row address latch unit 40 latches a row address RADD_PAD<m:0> inputted from a pad in response to the chip enable signal CEB and a latch control signal LAT_CON, and outputs latched row addresses ADD_LAT, ADDB_LAT and a row address RADD_L. The row decoder 50 decodes the latched row addresses ADD_LAT and ADDB_LAT.

The reset signal transition detector 60 detects transition of a reset signal RESET in response to the chip enable signal CEB in an initial operation, and outputs a reset transition detecting signal RTD. The address transition detector 70, latched by the row address latch unit 40, detects transition of the row address RADD_L, and outputs the address transition detecting signal ATD<m:0>. In a write mode, the write enable signal transition detector 80 detects transition of a write enable signal WEB in response to the chip enable signal CEB, and outputs a write enable transition detecting signal WTD.

The synthesizer 90 synthesizes the reset transition detecting signal RTD, the address transition detecting signal ATD and the write enable transition detecting signal WTD, and outputs a transition synthesizing signal ATD_S. The chip control signal generator 100 selectively generates chip control signals for driving a memory chip as the chip enable signal CEB and the transition synthesizing signal ATD_S.

Figure 4:
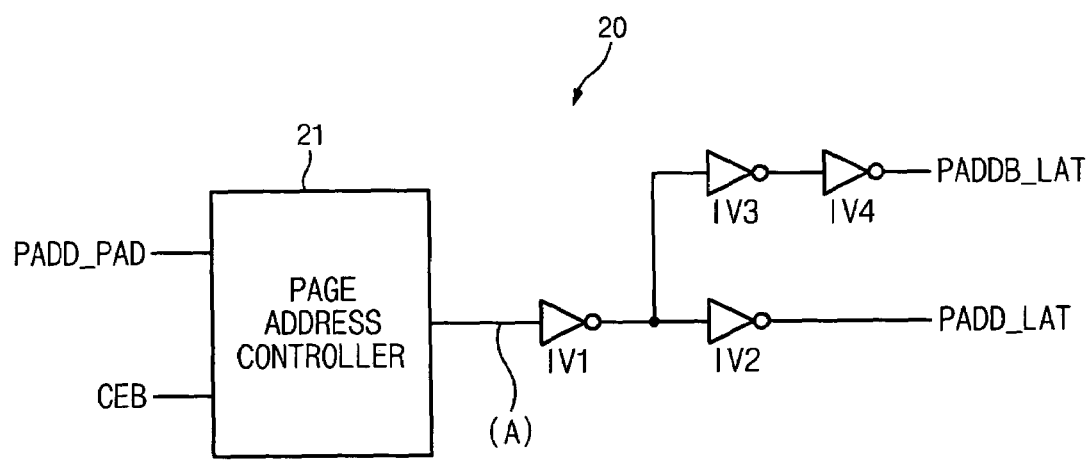
FIG. 4 is a diagram of a page address latch unit of FIG. 3.

FIG. 4 is a diagram of the page address latch unit 20 of FIG. 3.

The page address latch unit 20 comprises a page address controller 21 and inverters IV1~IV4. Here, the page address controller 21 latches the page address PADD_PAD inputted from the pad in response to the chip enable signal CEB, and selectively outputs the latches address.

The inverters IV1 and IV2 non-inverts and delays a signal applied from the node A, and outputs the latched page address PADD_LAT. The inverters IV3 and IV4 non-inverts and delays an output signal from the inverter IV1, and outputs the latches page address PADDB_LAT.

Figure 5:
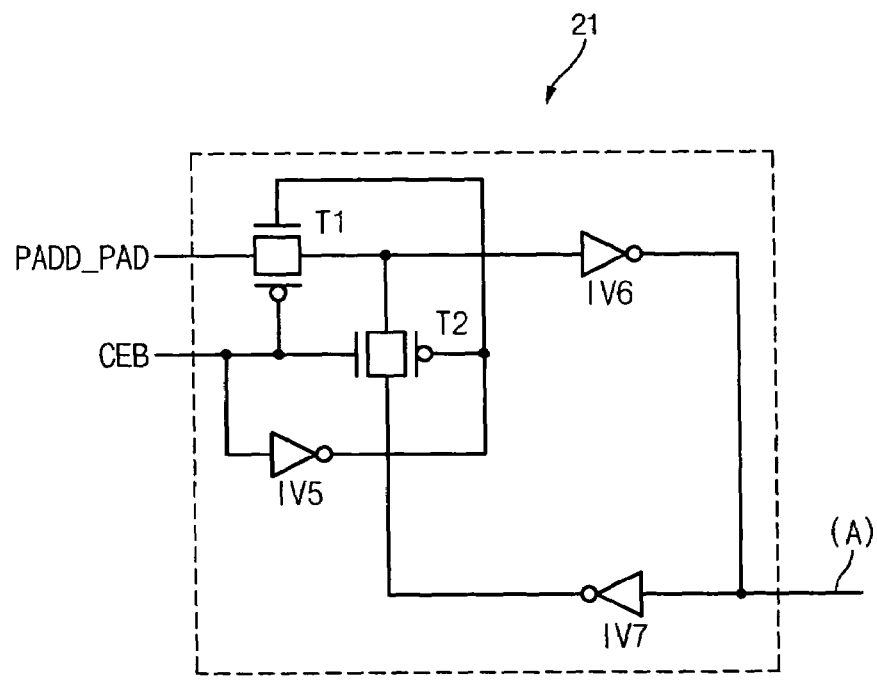
FIG. 5 is a circuit diagram of a page address controller of FIG. 4.

FIG. 5 is a circuit diagram of the page address controller 21 of FIG. 4.

The page address controller 21 comprises transmission ages T1 and T2, and inverters IV5~IV7. The inverter IV5 inverts the chip enable signal CEB. The transmission gate T1 is turned on while the transmission gate T2 is turned off, and vice versa. If the transmission gate T2 is turned on, the previously transmitted page address PADD_PAD is latched by the inverters IV6 and IV7, and outputted into the node A.

If the transmission gate T2 is turned off, a new page address PADD_PAD is transmitted into the inverter IV6 through the turned-on transmission gate T1. Thereafter, if the transmission gate T1 is turned off to disconnect a transmission path of the page address PADD_PAD, the inverters IV6 and IV7 perform a latch operation by the turned-on transmission gate T2. Then, the latched page address PADD_PAD is outputted into the node A.

The page address controller 21 inverts the page address PADD_PAD when the chip enable signal CEB is at a low level to output the inverted page address PADD_PAD, and latches the previous page address PADD_PAD when the chip enable signal CEB is at a high level.

Figure 6:
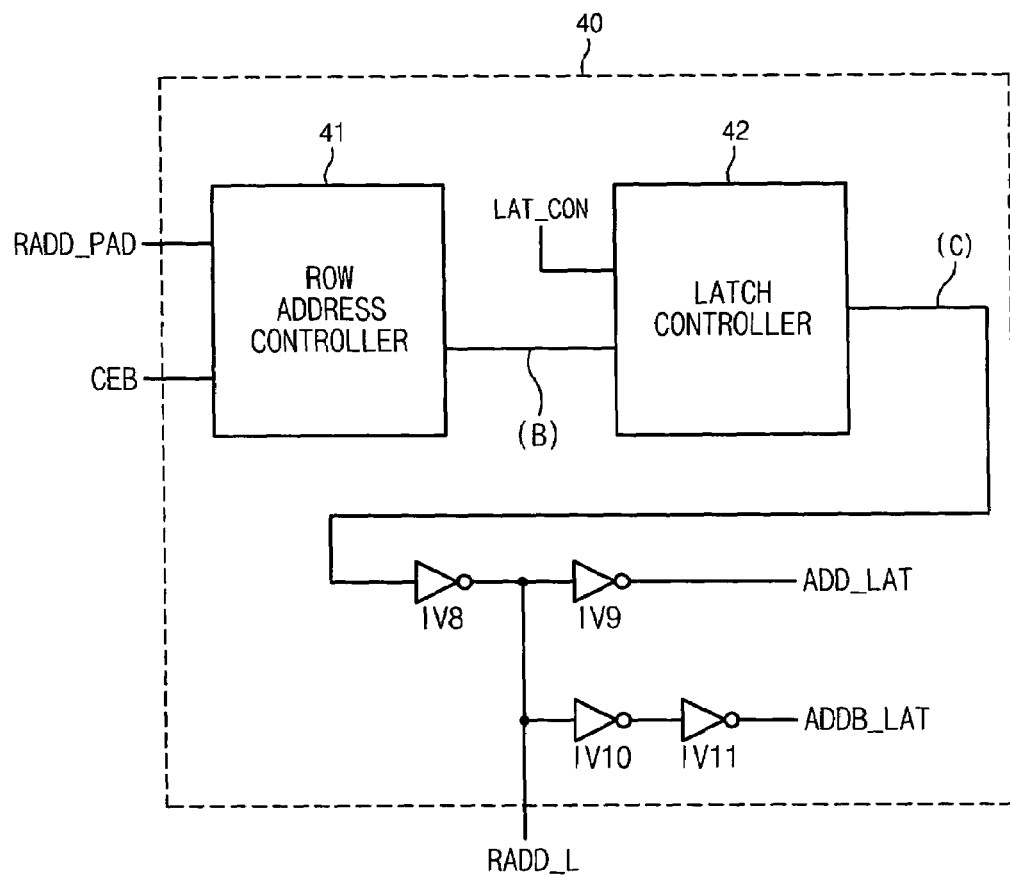
FIG. 6 is a diagram of a row address latch unit of FIG. 3.

FIG. 6 is a diagram of the row address latch unit 40 of FIG. 3.

The row address latch unit 40 comprises a row address controller 41, a latch controller 42 and inverters IV8~IV11. Here, the row address controller 41 latches the row address RADD_PAD inputted from the pad in response to the chip enable signal CEB to output the latched row address RADD_PAD into a node B. The latch controller 42 latches a signal applied from the node B in response to a latch control signal LAT_CON to output the latched signal into a node C.

The state of the latch control signal LAT_CON is determined depending on activation of the memory cell operation. The latch control signal LAT_CON transits to a high level when the driving operation of the memory cell starts, and transits to a low level when the driving operation of the memory cell ends.

The inverter IV8 inverts a signal applied from the node C, and outputs the row address RADD_L into the address transition detector 70. The inverter IV9 inverts an output signal from the inverter IV8, and the latched row address ADD_LAT. The inverters IV10 and IV11 non-inverts and delays an output signal from the inverter IV8, and outputs the latched row address ADDB_LAT. The inverters IV8~IV11 serve as an output unit of the row address latch unit 40.

Figure 7:
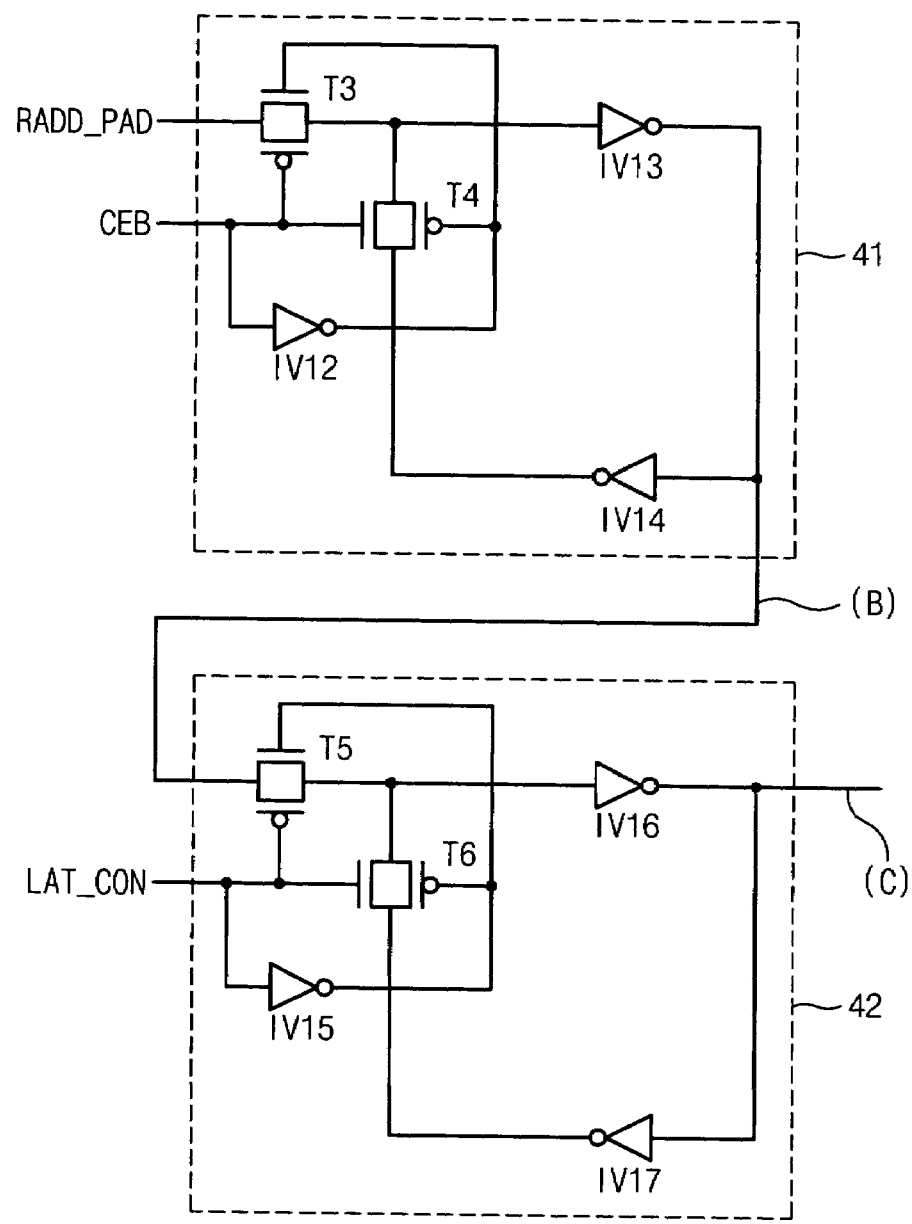
FIG. 7 is a circuit diagram of the row address latch unit of FIG. 6.

FIG. 7 is a circuit diagram of the row address latch unit 41 and the latch controller 42 of FIG. 6.

The row address controller 41 comprises transmission gates T3 and T4, and inverters IV12~IV14. The inverter IV12 inverts the chip enable signal CEB. The transmission gate T3 is turned on while the transmission gate T4 is turned off, and vice versa. If the transmission gate T4 is turned on, the previously transmitted row address RADD_PAD is latched by the inverters IV13 and IV14, and outputted into the node B.

If the transmission gate T4 is turned off, a new row address RADD_PAD is transmitted into the inverter IV13 through the turned-on transmission gate T3. If the transmission gate T3 is turned off to disconnect a transmission path of the row address RADD_PAD, the inverters IV13 and IV14 perform a latch operation by the turned-on transmission gate T4. Then, the latched row address RADD_PAD is outputted into the node B.

When the chip enable signal CEB is at a low level, the row address controller 41 inverts the row address RADD_PAD to output the inverted address into the node B. When the chip enable signal CEB is at a high level, the row address controller 41 latches the previous row address RADD_PAD.

The latch controller 42 comprises transmission gates T5 and T6, and inverters IV15~IV17. The inverter IV15 inverts the latch control signal LAT_CON. The transmission gate T5 selectively outputs an output signal from the node B in response to the latch control signal LAT_CON.

An output signal from the transmission gate T5 is latched in the inverters IV15 and IV16 having a latch structure for a predetermined time. The transmission T6 selectively outputs an output signal from the inverter IV17 in response to the latch control signal LAT_CON.

The latch control signal LAT_CON is determined depending on activation of the memory cell operation. The latch control signal LAT_CON transits to a high level when the driving operation of the memory cell starts, and transits to a low level when the driving operation of the memory cell ends.

While the memory cell is not driven, the latch control signal LAT_CON becomes at a low level, and the latch controller 42 inverts the output signal from the node B to output the inverted signal into the node C. While the memory cell is driven, the latch control signal LAT_CON becomes at a high level, and the latch controller 42 latches the output signal from the node B to prepare the next operation.

While the chip enable signal CEB is at a high level, the latch control signal LAT_CON becomes at the high level to prevent a newly inputted address from being transmitted into the latch controller 42. If the chip enable signal CEB is disabled to a low level, the latch control signal LAT_CON is also disabled at a low level to output a row address applied from the node B into the node C.

Figure 8:
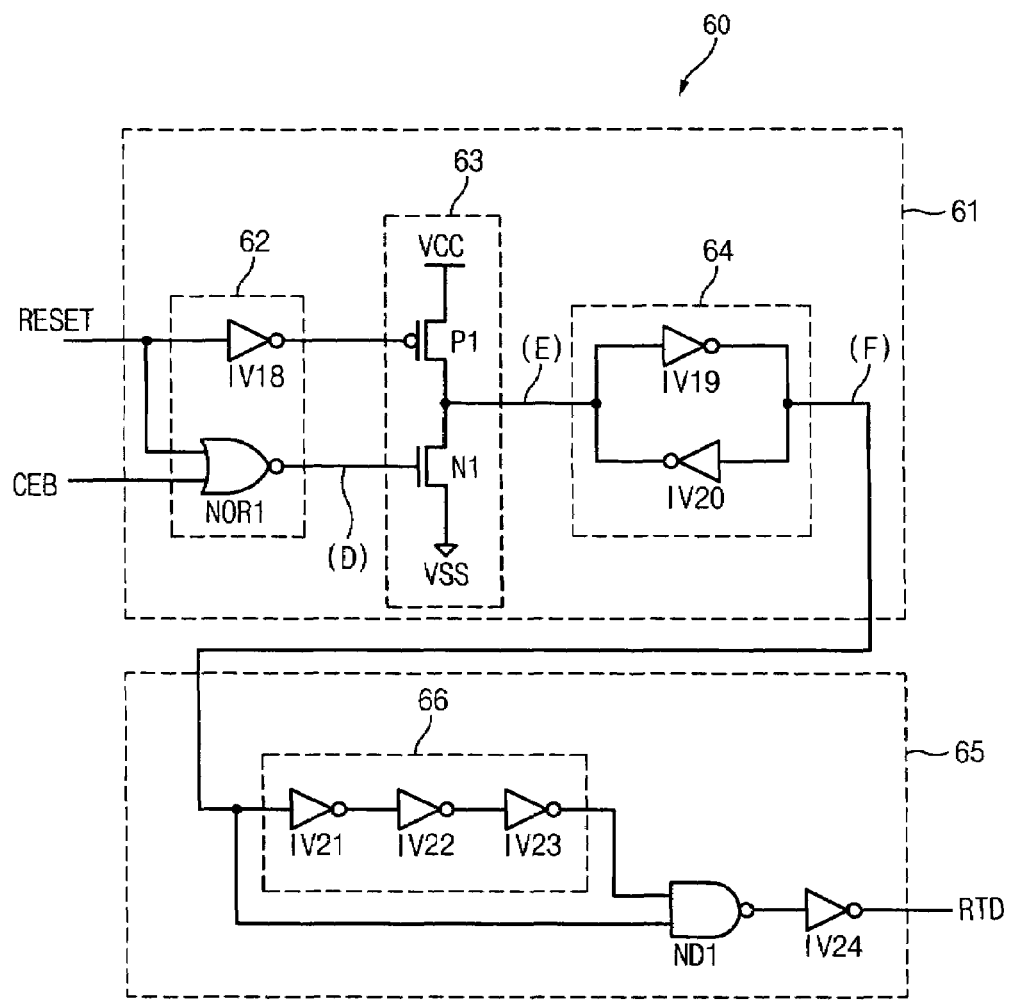
FIG. 8 is a circuit diagram of a reset signal transition detector of FIG. 3.

FIG. 8 is a circuit diagram of the reset signal transition detector 60 of FIG. 3.

The reset signal transition detector 60 comprises a reset signal detector 61 and a pulse generator 65.

The reset signal detector 61 which comprises an input controller 62, a driver 63 and a latch unit 64 detects initial generation of the reset signal RESET and activation of the chip enable signal CEB. The input controller 62 comprises an inverter IV18 and an NOR gate NOR1. The inverter IV18 inverts the reset signal RESET. The NOR gate NOR1 performs an NOR operation on the reset signal RESET and the chip enable signal CEB, and outputs the NOR operation result into a node D.

The driver 63 comprises a PMOS transistor P1 and an NMOS transistor N1 connected in series between a power voltage VCC terminal and a ground voltage VSS terminal. A gate of the PMOS transistor P1 receives an output signal from the inverter IV18, and a gate of the NMOS transistor N1 receives an output signal from the NOR gate NOR1. The latch unit 64 which comprises inverters IV19 and IV20 connected with a latch type latches a signal applied from a node E to output the latched signal into a node F.

The pulse generator 65 comprises a delay unit 66, an NAND gate ND1 and an inverter IV24. The delay unit 66 comprises inverters IV21~IV23 connected serially which non-invert and delay an output signal from the node F. The NAND gate ND1 performs an NAND operation on output signals from the delay unit 66 and the node F. The inverter IV24 inverts an output signal from the NAND gate ND1 to output the reset transition detecting signal RTD.

Figure 9:
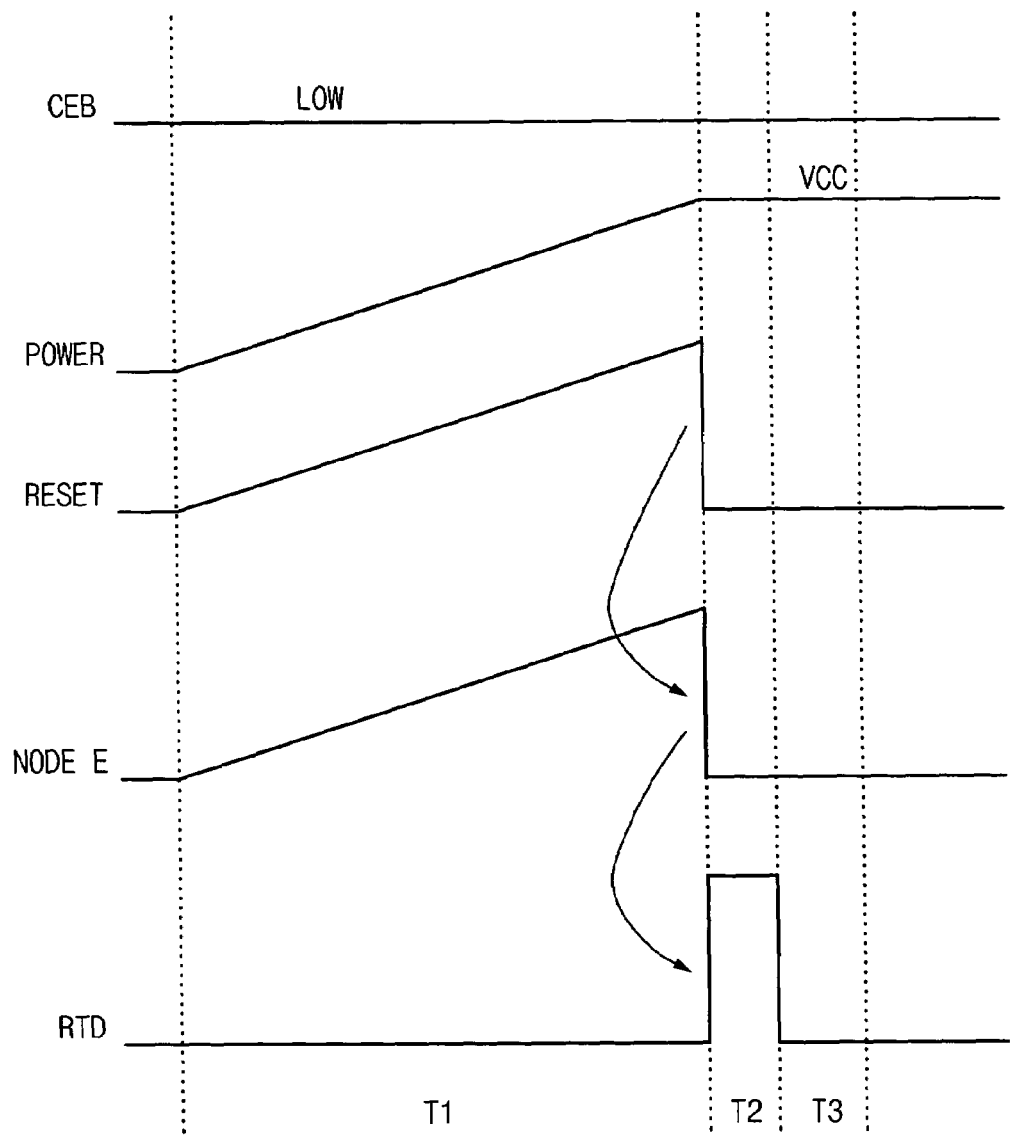
FIGS. 9 and 10 are timing diagrams illustrating the operation of the reset signal transition detector of FIG. 3.
Figure 10:
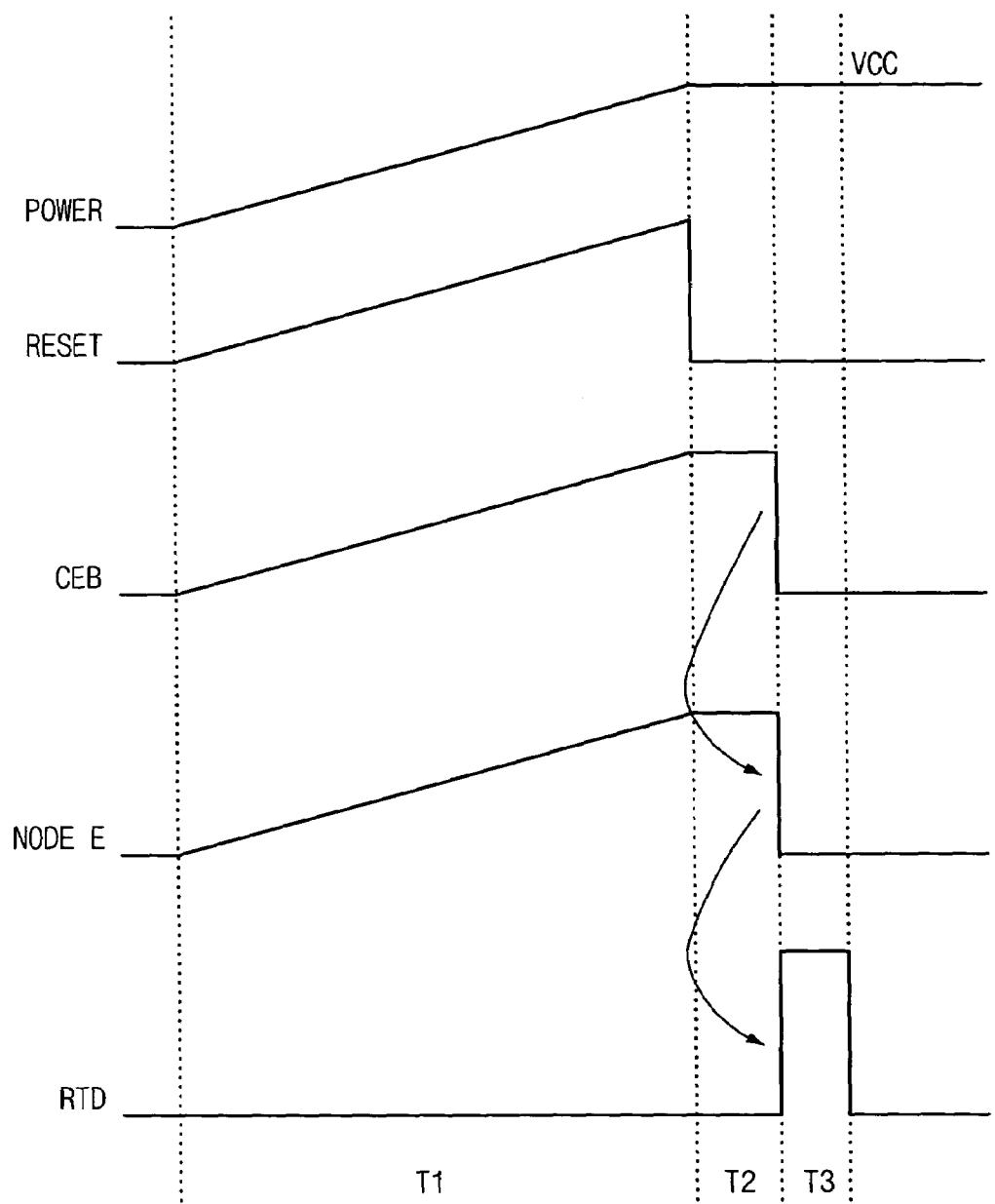

Referring to FIGS. 9 and 10, the operation of the reset signal transition detector 60 is described hereinafter.

While the chip enable signal CEB is disabled to the low level, if a power voltage is supplied, a voltage level of the reset signal RESET gradually rises according to the power voltage.

If the reset signal RESET is enabled over a predetermined level, the PMOS transistor P1 is turned on in response to an output signal from the inverter IV18, and a voltage level of the node E gradually rises according to the reset signal RESET. Here, the NMOS transistor N1 is kept turned off. Although there is a difference in voltage generating time of the reset signal RESET and the node E, the difference may be ignored in a CMOS operation region, and the difference is not shown in FIG. 9.

Thereafter, when the power voltage gradually rises over a threshold voltage VCC, the reset signal RESET transits to a high to low level. As a result, the NMOS transistor N1 is turned on to output the ground voltage VSS into the node E. An output signal from the node E is latched in the latch unit 64 for a predetermined time.

When the reset signal RESET is at a low level, the PMOS transistor P1 is kept turned off regardless of the state of the chip enable signal CEB. As a result, the node E is maintained at a low level.

Then, when the node F transits to a high level, the pulse generator 65 generates the reset transition detecting signal RTD having a pulse width for a delay time T2 of the delay unit 66.

FIG. 10 is a timing diagram illustrating the operation when the chip enable signal CEB is disabled to the low level later than the reset signal RESET for an interval T2.

When the reset signal RESET is disabled to the low level earlier than the chip enable signal CEB, the NMOS transistor N1 is kept turned off by the chip enable signal CEB, and the node E is maintained at a high level.

When an interval T3 starts and the chip enable signal CEB transits to the low level, the NMOS transistor N1 is turned on to pull down the voltage of the node E. The output signal from the node E is latched in the latch unit 64 for a predetermined time.

When the reset signal RESET is at the low level, The PMOS transistor P1 is kept turned off regardless of the state of the chip enable signal CEB. As a result, the node E is continuously maintained at the low level.

When the voltage level of the node F transits to a high level, the pulse generator 65 generates the reset transition detecting signal RTD having a pulse width for a delay time T3 of the delay unit 66.

Figure 11:
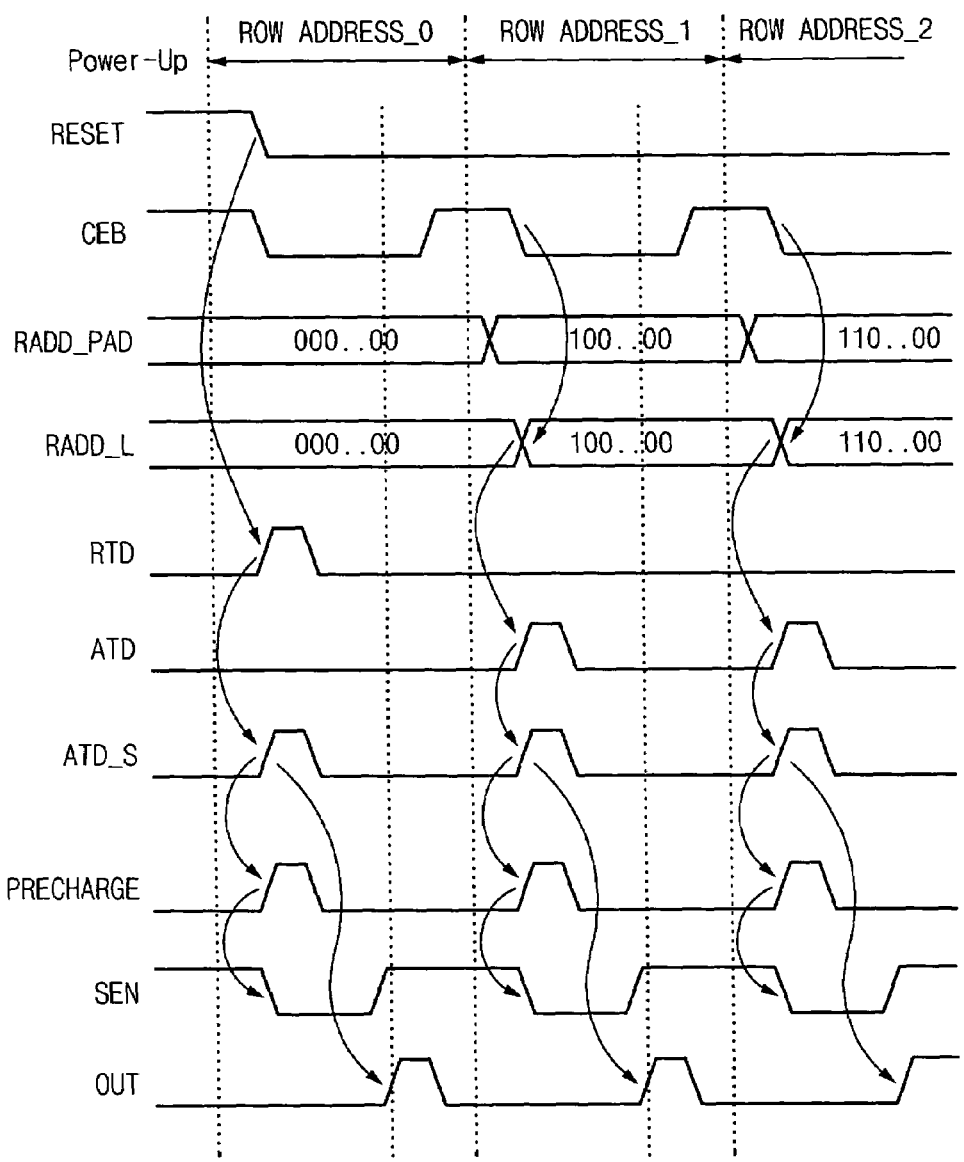
FIGS. 11 to 18 are timing diagrams illustrating the operation of a nonvolatile ferroelectric memory control device according to an embodiment of the present invention.

FIG. 11 is a timing diagram illustrating the operation of a nonvolatile ferroelectric memory control device when the chip enable signal CEB toggles.

After a power-on operation, the reset signal RESET and the chip enable signal CEB are disabled to the low level, and the reset transition detecting signal RTD is generated when the first row address is inputted. Here, the address transition detecting signal ATD is not generated because the first row address RADD-PAD(000..00) inputted after the power-on reset operation is not changed.

Thereafter, the synthesizer 90 generates the transition synthesizing signal ATD_S, a precharge signal and a sense amplifier enable signal SEN when the reset transition detecting signal RTD is enabled. The chip control signal generator 100 generates a memory cell operation signal OUT.

When a second row address RADD_PAD(1000..00) is changed and the chip enable signal CEB is disabled to the low level, the latched row address RADD_L is outputted. The address transition detector 70 generates the address transition detecting signal ATD, and the chip control signal generator 100 outputs the memory cell operation signal OUT in response to the address transition detecting signal ATD.

When the address transition detecting signal ATD or the reset transition detecting signal RTD is activated, a sense amplifier is equalized and maintained at an initial state. In the rest intervals, when the chip enable signal CEB is enabled to the high level, the sense amplifier is maintained at an active state. As a result, the sense amplifier can access the previous data immediately by the chip enable signal CEB and an output enable signal OEB.

Figure 12:
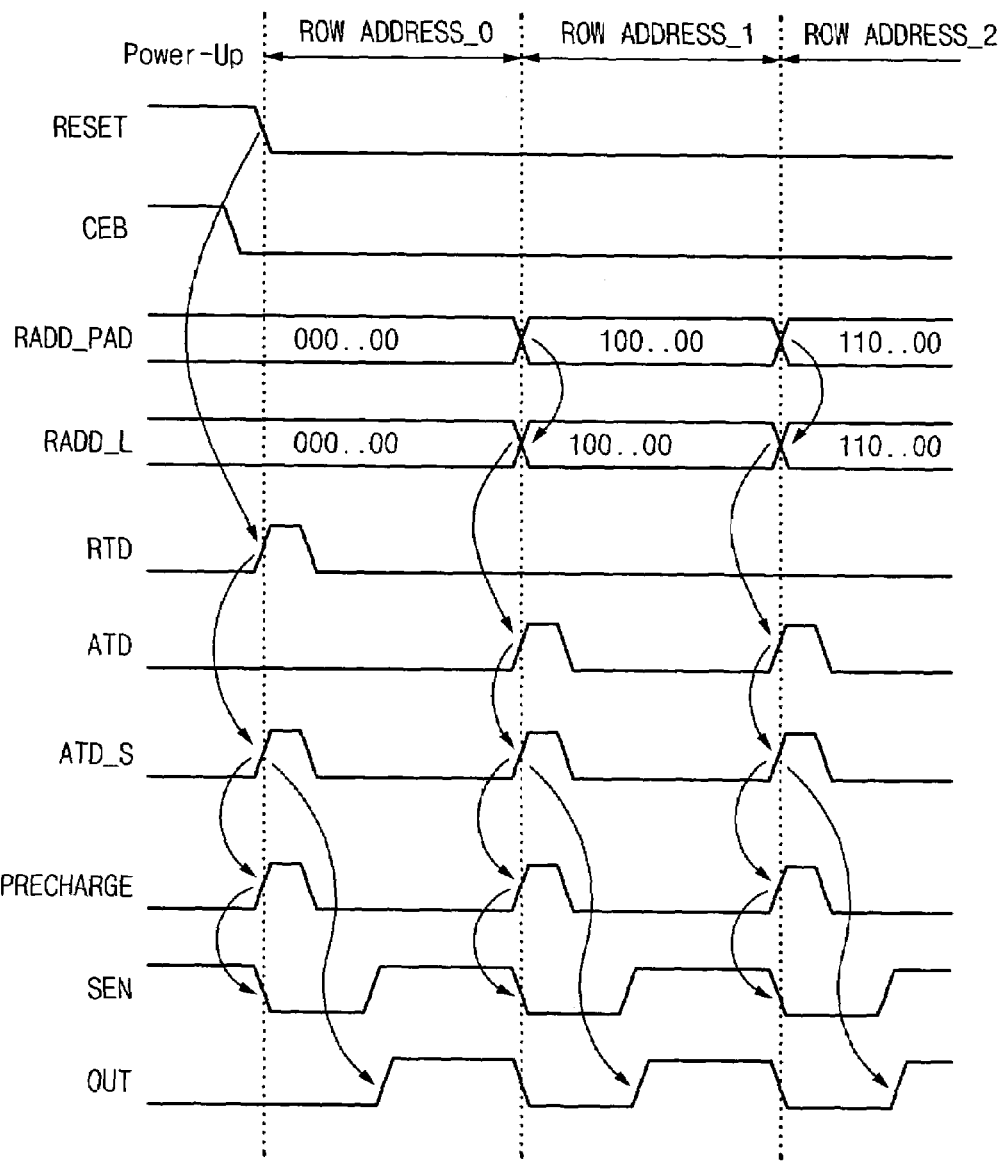

FIG. 12 is a timing diagram illustrating the operation of a nonvolatile ferroelectric memory control device when the chip enable signal CEB is maintained at the low state.

After the power-on operation, the reset signal RESET and the chip enable signal CEB are disabled to the low level, and the reset transition detecting signal RTD is generated in input of a first row address. If the reset signal RESET disabled to the high to low level while the chip enable signal CEB is at the low level, the reset transition detecting signal RTD is generated synchronously with respect to the disable time of the reset signal RESET.

IF the second row address RADD_PAD(1000..00) is changed when the chip enable signal CEB is disabled to the low level, the address transition detector 70 generates the address transition detecting signal ATD. The chip control signal generator 100 generates the memory cell operation signal OUT in response to the address transition detecting signal ATD.

Figure 13:
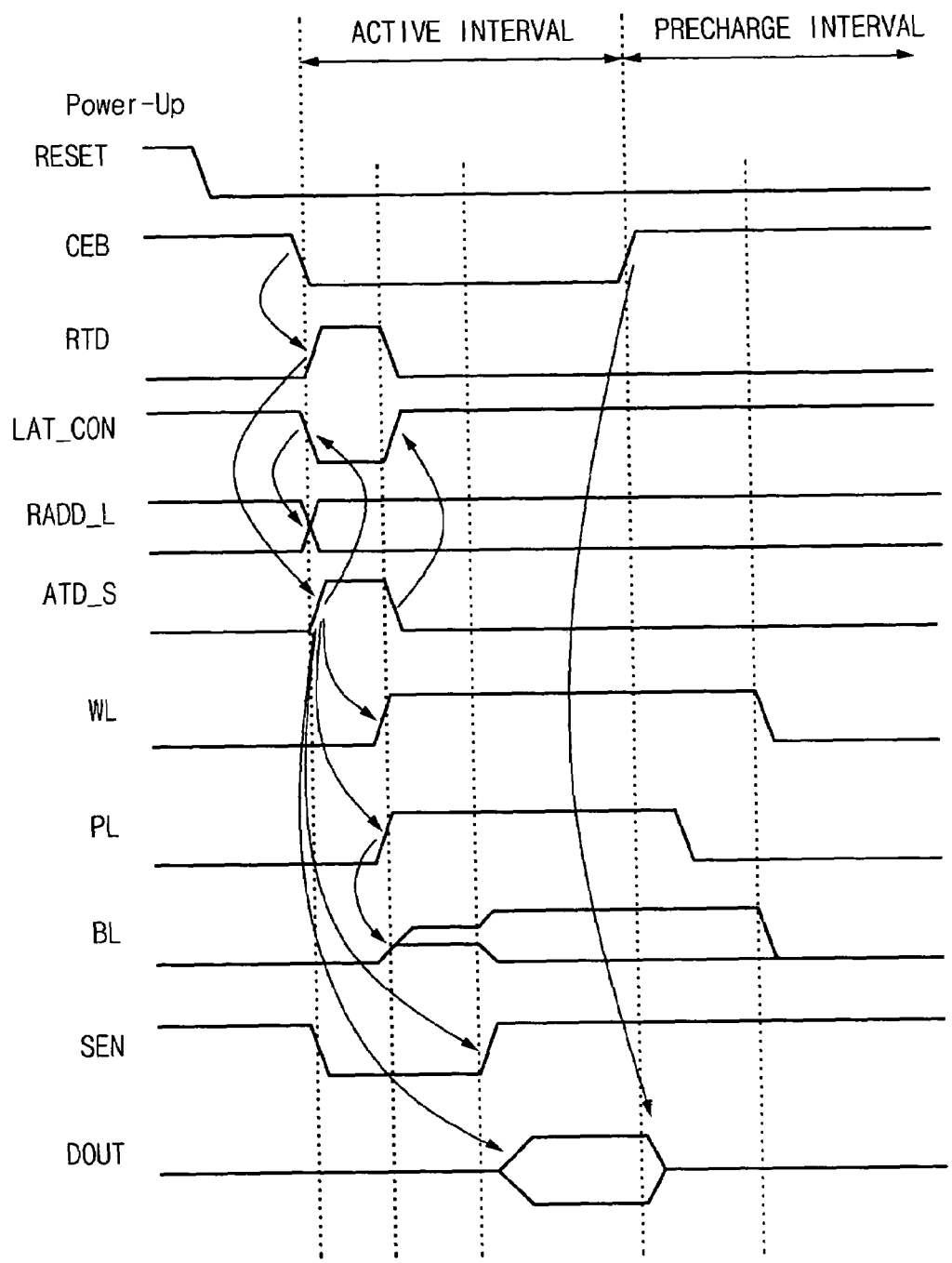

FIG. 13 is a timing diagram illustrating the operation of a nonvolatile ferroelectric memory control device when the reset transition detecting signal RTD is generated by the chip enable signal CEB in the chip operation by the first row address.

After the power-on, the reset signal RESET and the chip enable signal CEB are disabled to the low level, and the reset transition detecting signal RTD is generated in input of the first row address. IF the chip enable signal CEB is disabled to the low level later than the reset signal RESET, the reset transition detecting signal RTD is generated synchronously with respect to the disable time of the chip enable signal CEB. That is, when both of the reset signal RESET and the chip enable signal CEB become at the low level, the reset transition detecting signal RTD is generated.

While the chip enable signal CEB is at the high level, the latch control signal LAT_CON becomes at the high level. However, while the reset transition detecting signal RTD is at a high level, the latch control signal LAT becomes at a low level.

Then, if the latch control signal LAT_CON transits to the low level, the row address RADD_L is outputted into the address transition detector 70. The synthesizer 90 outputs the transition synthesizing signal ATD_S. As a result, the sense amplifier enable signal SEN is disabled to a low level, and a wordline WL, plateline PL and a bitline BL are enabled to a high level. IF the sense amplifier enable signal SEN transits to a high level, output data DOUT stored in the memory cell are outputted.

Thereafter, if the chip enable signal CEB is enabled to the high level in a precharge interval, the output data DOUT is no longer is outputted.

Figure 14:
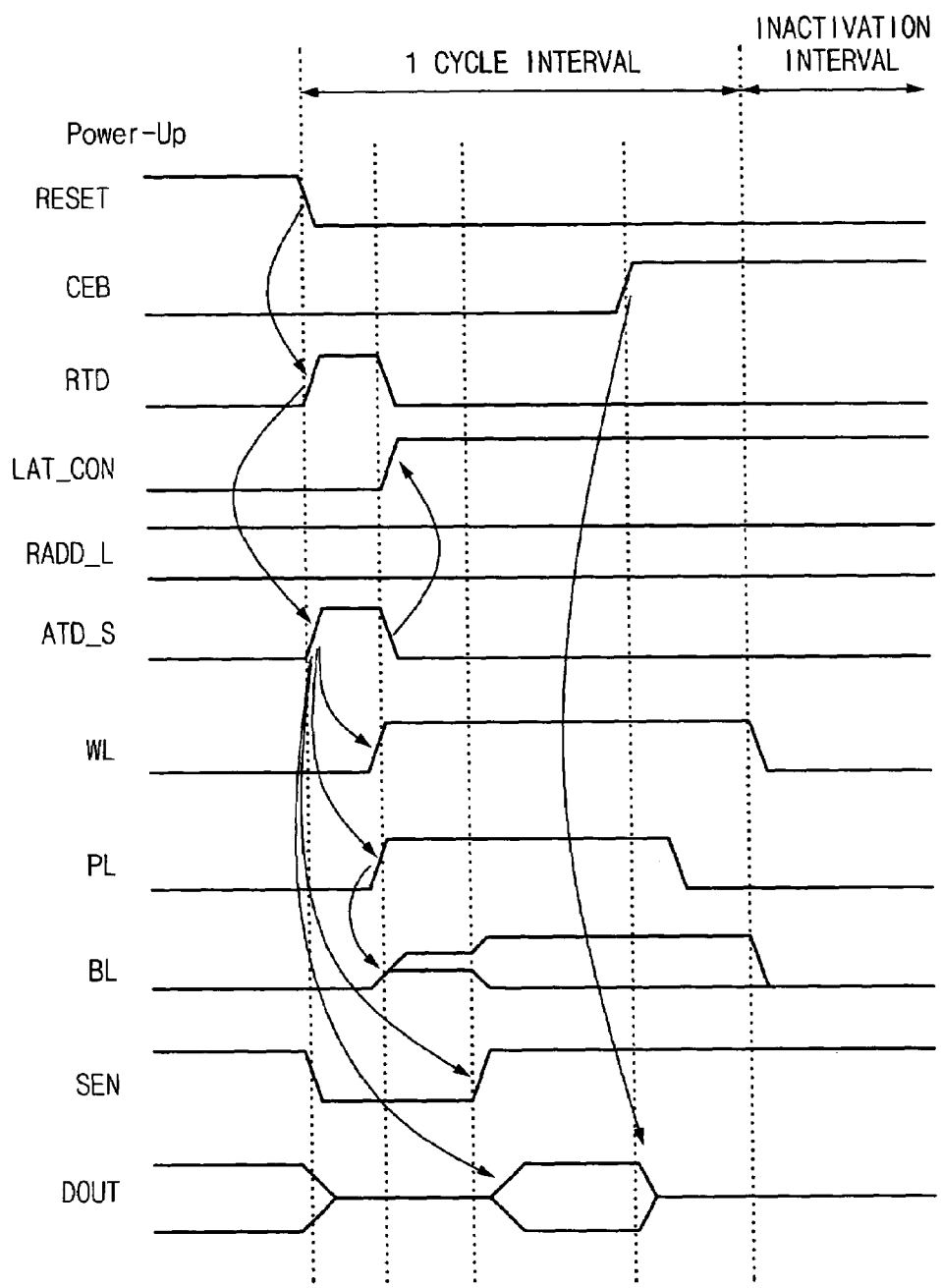

FIG. 14 is a timing diagram illustrating the operation of a nonvolatile ferroelectric memory control device when the reset transition detecting signal RTD is outputted by the reset signal RESET in the chip operation by the first row address.

After the power-on, the reset signal RESET is disabled, and the reset transition detecting signal RTD is generated in input of the first row address. IF the reset signal RESET is disabled to the low level while the chip enable signal CEB is disabled, the reset transition detecting signal RTD is generated synchronously with respect to the disable time of the reset signal RESET.

That is, when both of the reset signal RESET and the chip enable signal CEB are become at the low level, the reset transition detecting signal RTD is generated. Here, When the row address RADD_L is not changed, the transition synthesizing signal ATD_S is generated in response to the reset transition detecting signal RTD.

When the chip enable signal CEB is at the low level, the latch control signal LAT_CON is at the high level only in driving of the cell, and disabled to the low level in the rest intervals. However, the transition synthesizing signal ATD_S is generated by the reset transition detecting signal RTD to disable the sense amplifier enable signal SEN.

IF the latch control signal LAT_CON transits to the high level, the wordline WL, the plateline PL and the bitline BL are enabled to a high level. IF the sense amplifier enable signal SEN transits to a high level, the output data DOUT stored in the memory cell is normally outputted. Thereafter, if the chip enable signal CEB is enabled to the high level, the output data DOUT is no longer outputted.

Figure 15:
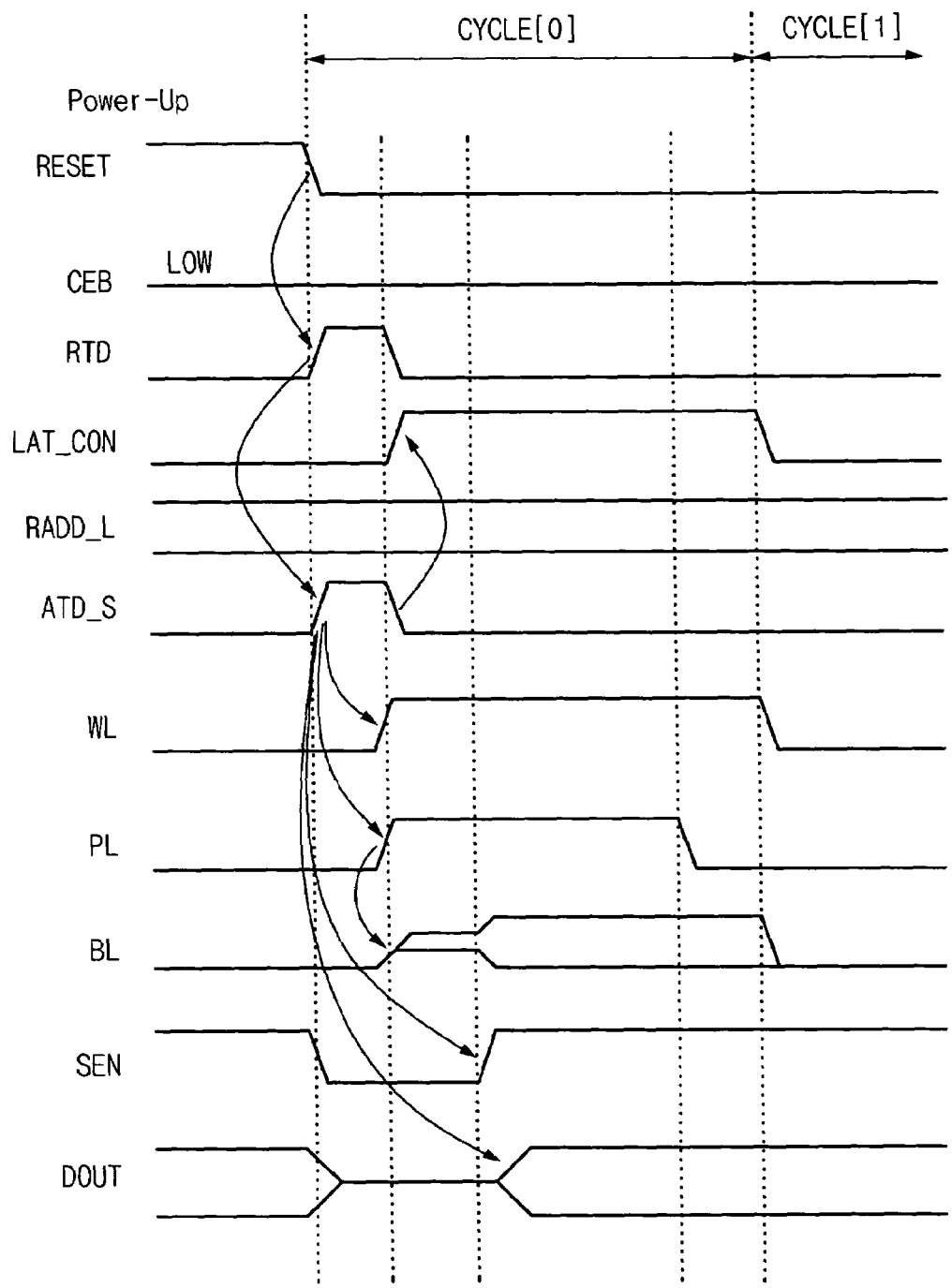

As shown in FIG. 15, the output data DOUT are continuously outputted when the chip enable signal CEB is kept disabled. That is, the sense amplifier is kept active to continuously store data corresponding to the previous cycle address when the row address is changed before a new cell operation.

The sense amplifier is initialized only when a new row address is inputted to generate the address transition detecting signal ATD. Here, the sense amplifier enable signal SEN controls activation of the sense amplifier. While the sense amplifier enable signal SEN is activated to a high level, data can be outputted externally using the output enable signal OEB or the chip enable signal CEB.

In a read mode, the sense amplifier is kept active although the memory cell is not operated. As a result, when the row address RADD_PAD inputted in the previous cycle is not changed, the corresponding page address stored in the sense amplifier is immediately outputted.

In a write mode, the write enable signal WEB is disabled to a low level and a write command is inputted, the synthesizer 90 generates the transition synthesizing signal ATD_S in response to the write enable transition detecting signal WTD. Thus, the chip control signal generator 100 operates to write data normally in the corresponding memory cell.

Figure 16:
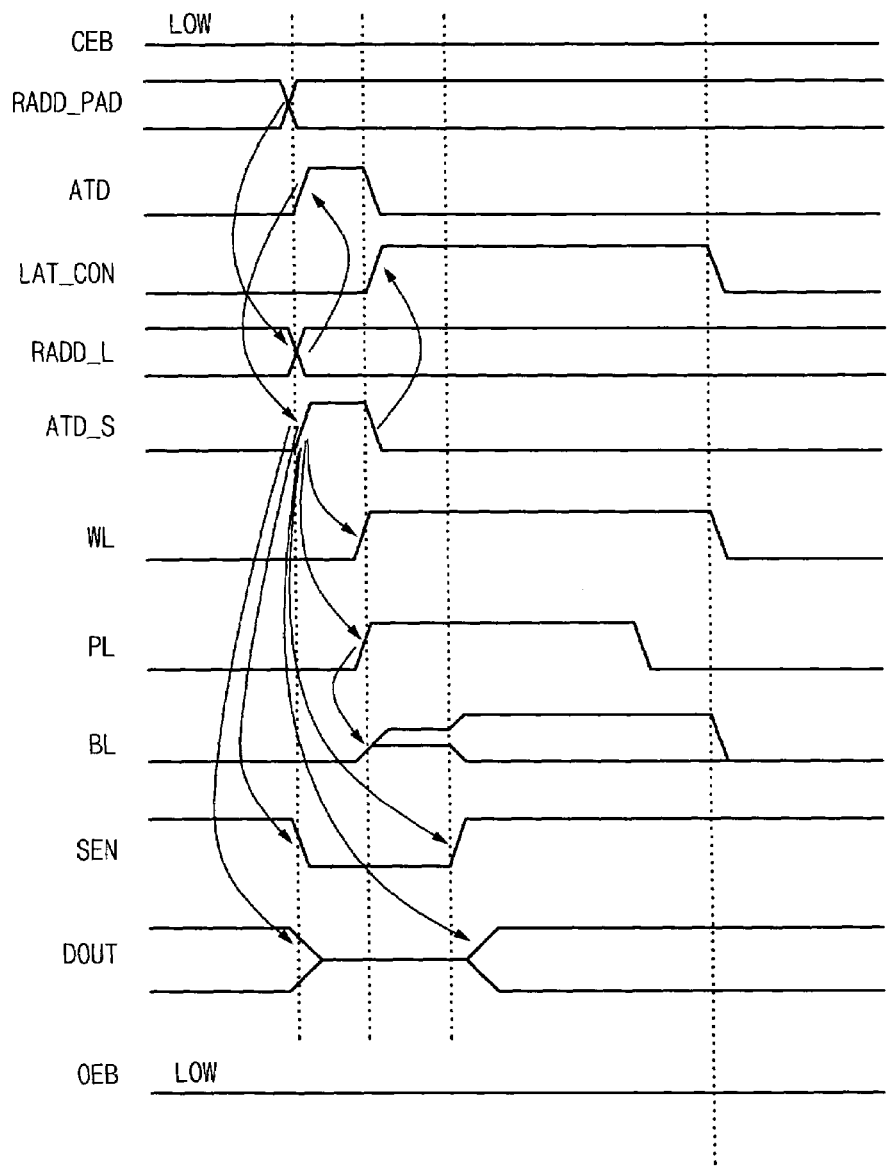

FIG. 16 is a timing diagram illustrating the operation when the chip enable signal CEB and the output enable signal OEB are fixed at the low level and the row address RADD_PAD is changed.

When the chip enable signal CEB and the output enable signal OEB are at the low level and the row address RADD_PAD is changed, the address transition detecting signal ATD is generated. As a result, the transition synthesizing signal ATD_S is generated, and the sense amplifier enable signal SEN is disabled to the low level.

Thereafter, the transition synthesizing signal ATD_S is disable to the low level and the latch control signal LAT_CON is enabled to the high level, the wordline WL, the plateline PL and the bitline BL are enabled to the high level. Then, if the sense amplifier enable signal SEN is enabled to the high level, the output data DOUT are continuously outputted.

When the chip enable signal CEB is maintained at the low level, the latch controller 42 continuously outputs the row address RADD_PAD. As a result, the address detector 70 generates the address transition detecting signal ATD so that the chip operation may be normally performed.

Figure 17:
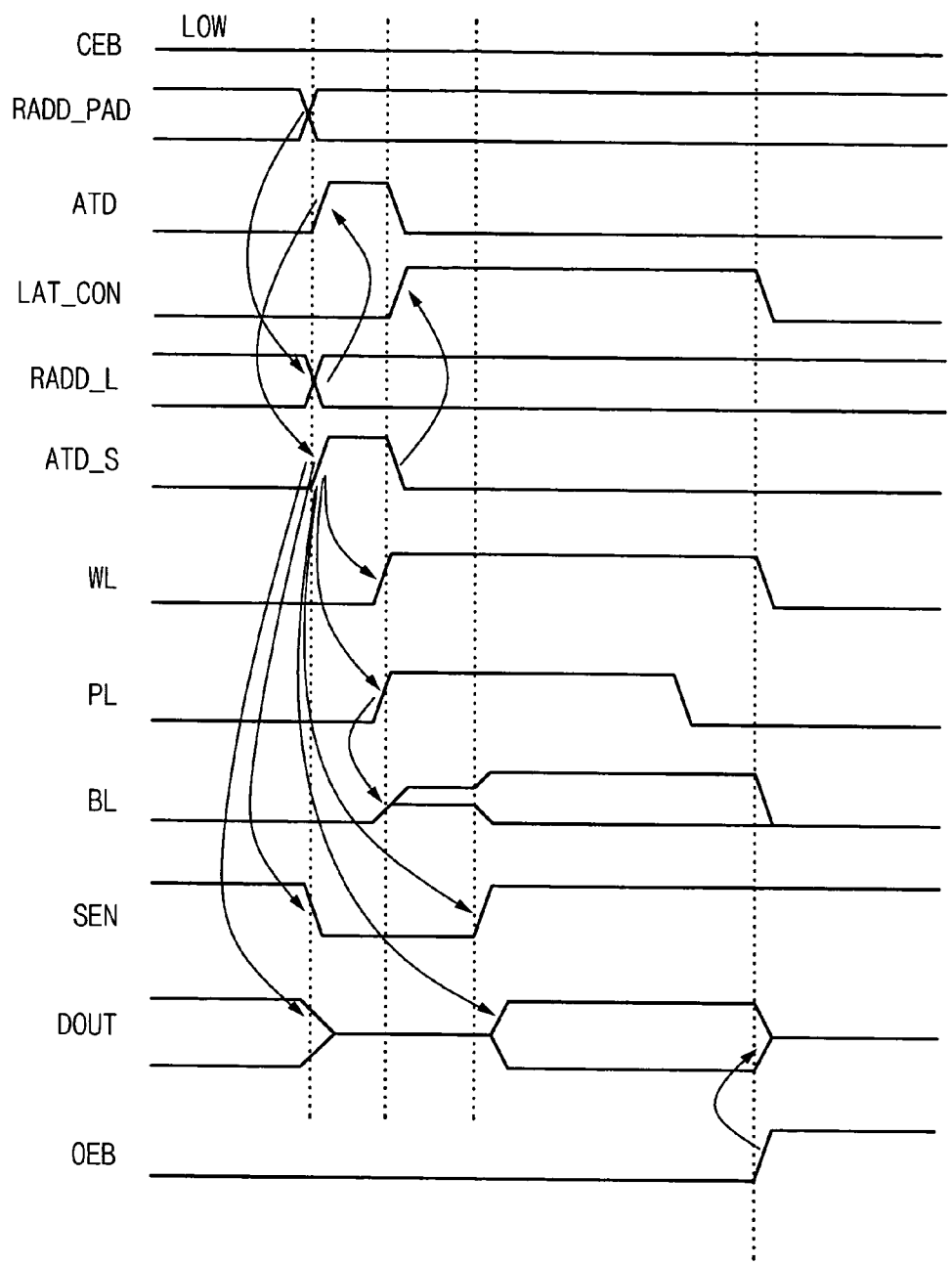

As shown in FIG. 17, if the output enable signal OEB is enabled to the high level, the output data DOUT is no longer outputted.

Figure 18:
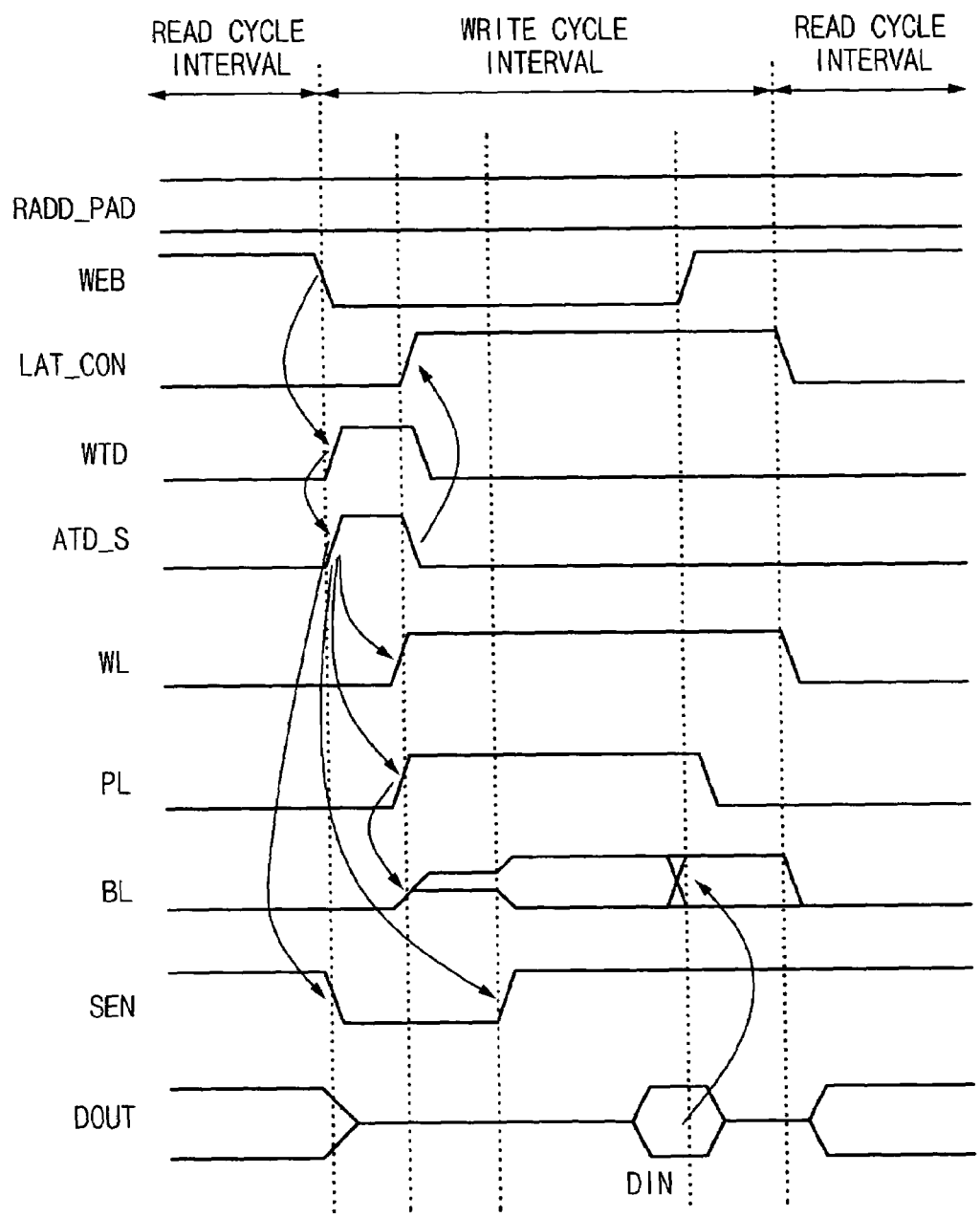

FIG. 18 is a timing diagram illustrating the operation of the write enable transition detecting signal WTD depending on activation of the write enable signal WEB.

In the read mode, the write enable signal WEB and the sense amplifier enable signal SEN are maintained at a high level, and the output data DOUT are outputted.

Thereafter, in the write mode, the write enable signal WEB transit to a low level, and the write enable transition detecting signal WTD is generated. Then, the transition synthesizing signal ATD_S is enabled by the write enable transition detecting signal WTD.

IF the latch control signal LAT_CON is enabled to the high level, the wordline WL, the plateline PL and the bitline BL are enabled to the high level, and the sense amplifier enable signal SEN is enabled to the high level. As a result, input data DIN are written in a corresponding cell by the chip control signal generator 100 so that the normal write operation may be performed.

Here, the sense amplifier is kept active to continuously store data inputted in the previous address cycle before the write enable transition detecting signal WTD is generated.

Figure 19:
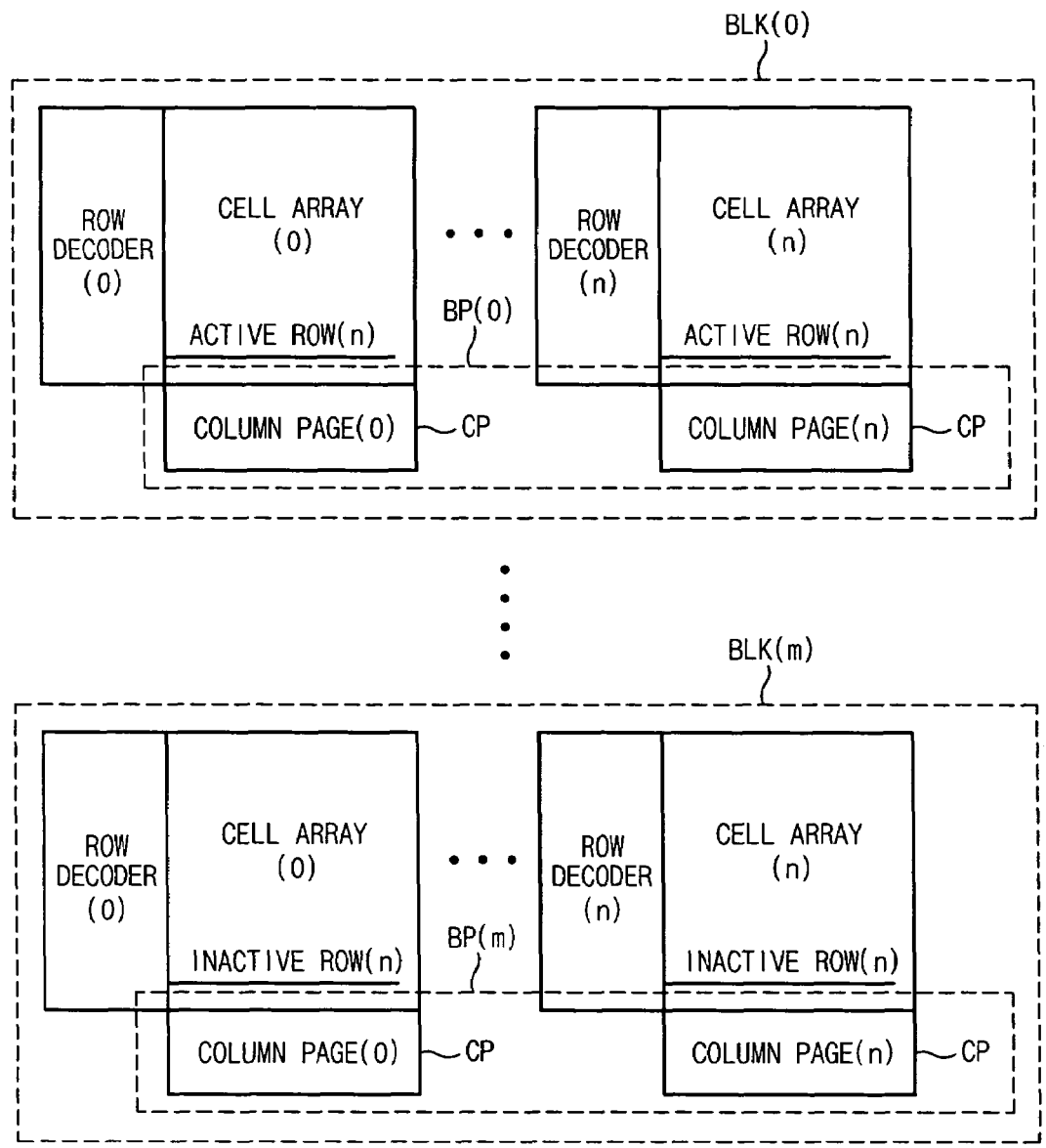
FIG. 19 is a diagram illustrating an example of a nonvolatile ferroelectric memory according to an embodiment of the present invention.

FIG. 19 is a diagram illustrating an example of a nonvolatile ferroelectric memory according to an embodiment of the present invention.

In an embodiment, the nonvolatile ferroelectric memory comprises a plurality of unit blocks BLK(0)~BLK(m). One unit block BLK comprises a plurality of cell arrays, a plurality of row decoders and a plurality of column pages CP. The plurality of column pages CP in one unit block BLK constitute a unit block page BP. The plurality of column pages CP in the block page BP are activated or inactivated at the same time. Also, a row region located in the same unit block BLK is activated or inactivated at the same time.

Figure 20:
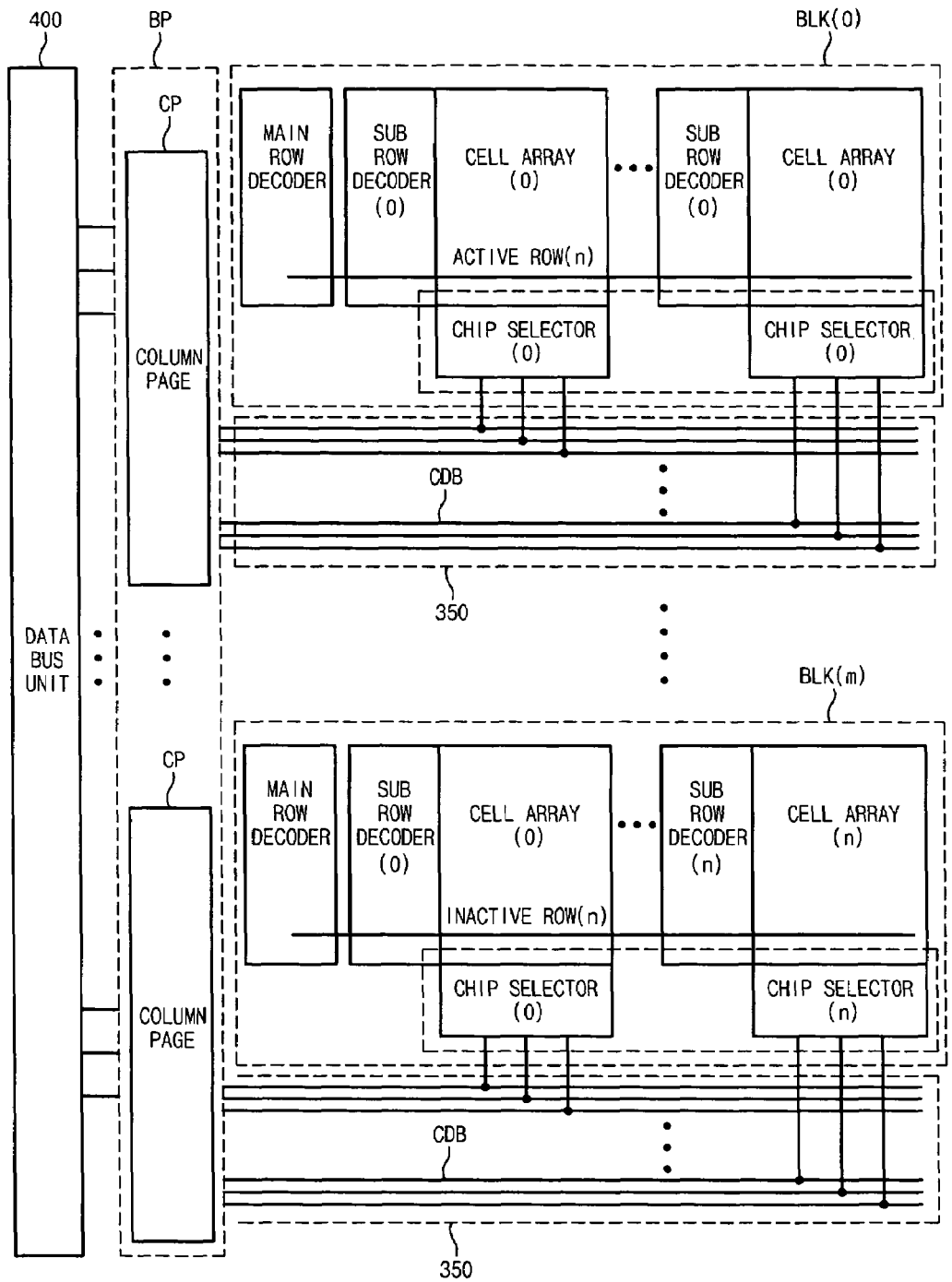
FIG. 20 is a diagram illustrating another example of a nonvolatile ferroelectric memory according to an embodiment of the present invention.

FIG. 20 is a diagram illustrating another example of a nonvolatile ferroelectric memory according to an embodiment of the present invention.

In another embodiment, the nonvolatile ferroelectric memory comprises a plurality of unit blocks BLK(0)~BLK(m), a common data bus unit 350, a block page BP and a data bus unit 400. One unit block BLK comprises a main row decoder, a plurality of sub row decoders, a plurality of cell arrays and a plurality of chip selectors. Here, a row region placed in the same location of the same unit block BLK is activated or inactivated simultaneously. The plurality of sub row decoders are controlled by one main row decoder.

The plurality of chip selectors connected the common data bus CDB of the common data bus unit 350. The plurality of column pages CP constitute one unit block page BP, which is connected to the common data bus CDB. The plurality of column pages CP in the block page BP are activated or inactivated at the same time, which are connected to the data bus unit 400.

Figure 21:
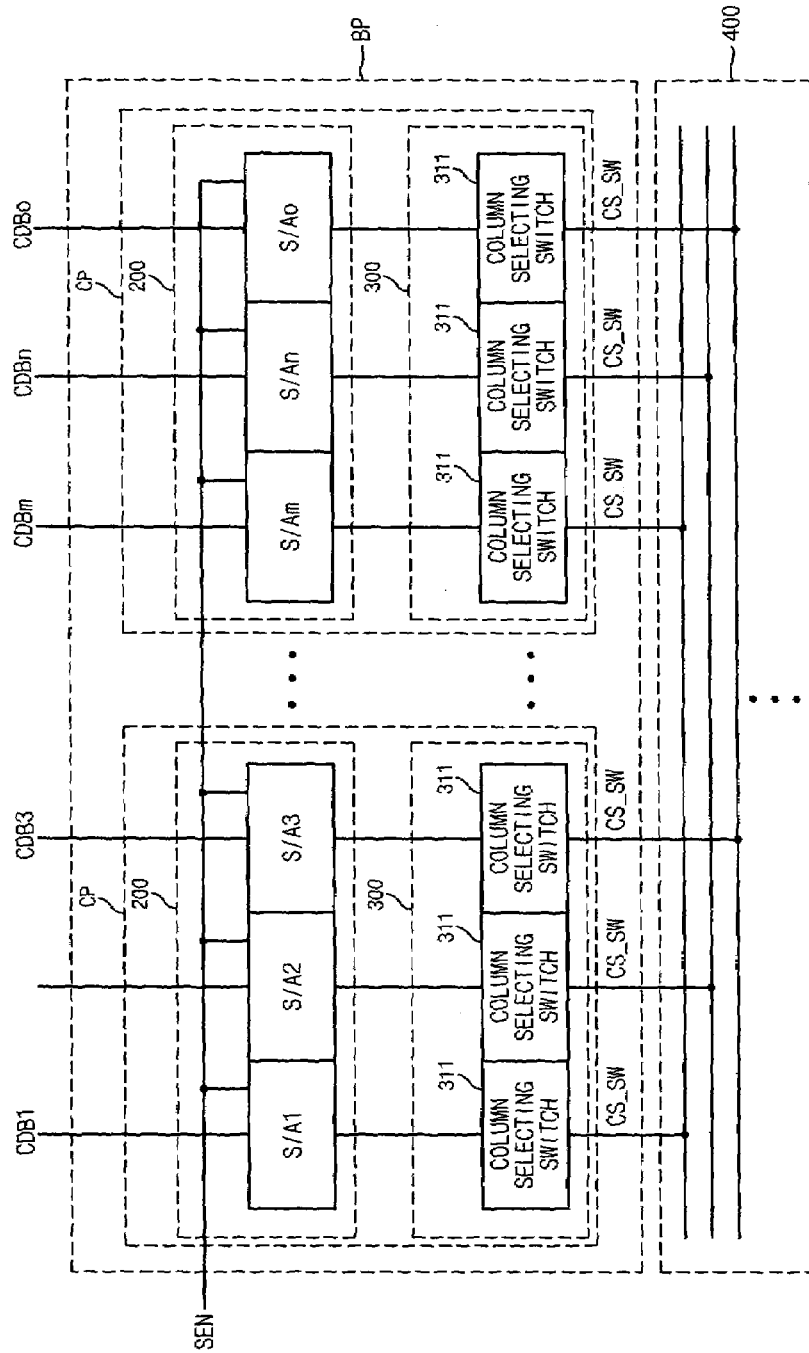
FIG. 21 is a structural diagram of a block page of FIG. 20.

FIG. 21 is a structural diagram of the block page BP of FIG. 20.

One block page BP comprises a plurality of column pages CP. One column page CP comprises a sense amplifier buffer unit 200 and a column selector 300. The sense amplifier buffer unit 200 comprises a plurality of sense amplifiers S/A connected one by one to a plurality of common data bus CDB. The sense amplifier enable signal SEN is applied in common to all sense amplifiers S/A to determined activation of the sense amplifiers S/A.

The column selector 300 comprises a plurality of column selecting switches 311 connected one by one to the plurality of sense amplifiers S/A. A plurality of data buses in the data bus unit 400 are connected to the plurality of column selecting switches 311 to control input/output operation of a column selecting signal CS_SW.

Figure 22:
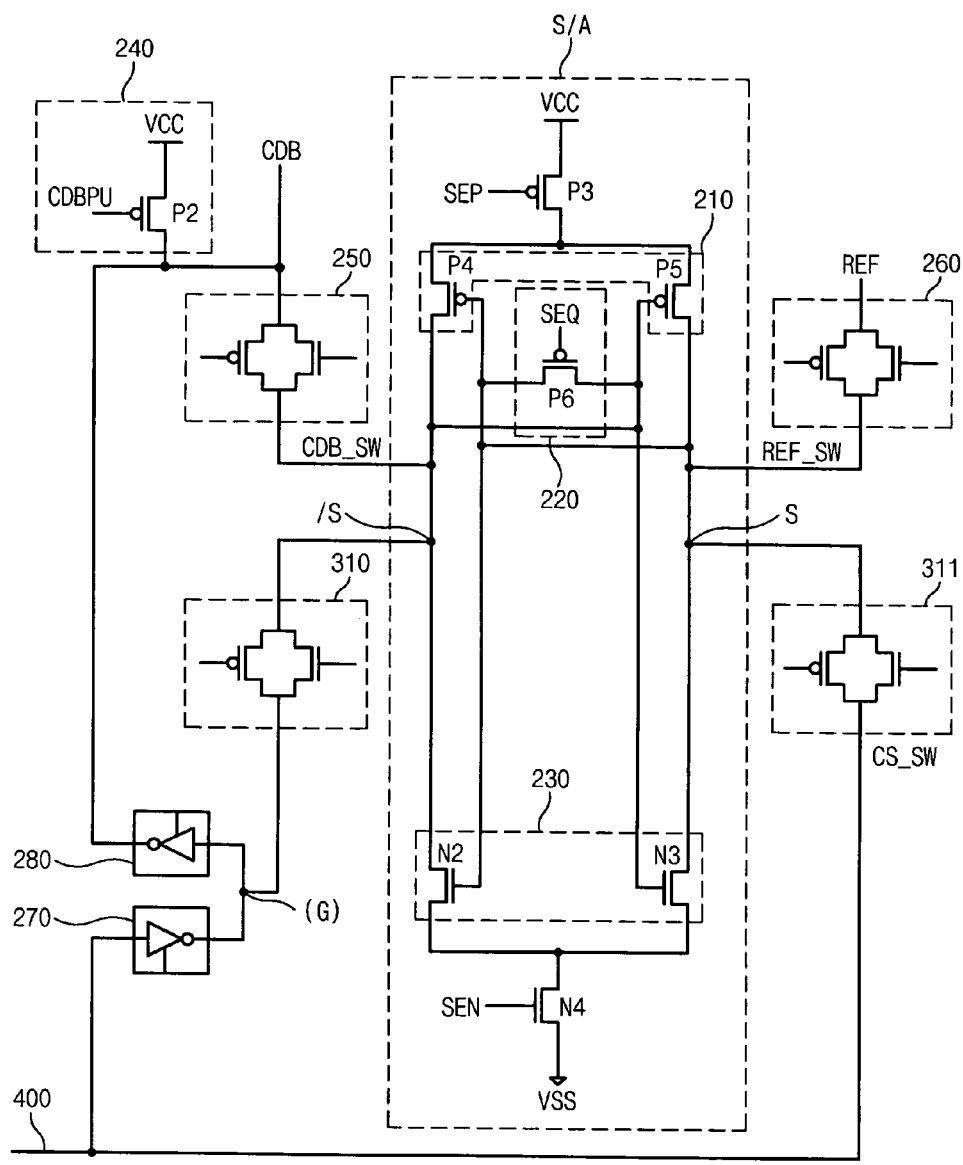
FIGS. 22 and 23 are circuit diagrams of a sense amplifier of FIG. 21.

FIG. 22 is a circuit diagram of the sense amplifier S/A and its adjacent circuits of FIG. 21.

The sense amplifier S/A comprises a pull-up switch P3, a PMOS latch amplification unit 210, an equalizing unit 220, an NMOS latch amplification unit 230 and a pull-down switch N4.

The pull-up switch P3 as an activation regulating switch supplies a power voltage VCC to the PMOS latch amplification unit 210 in response to a sense amplifier enable signal SEP. The pull-down switch N4 as an activation regulating switch supplies a ground voltage VSS to the NMOS latch amplification unit 230 in response to the sense amplifier enable signal SEN. Here, the sense amplifier enable signal SEP has an opposite phase to the sense amplifier enable signal SEN.

The PMOS latch amplification unit 210, located between the pull-up switch P3 and the NMOS latch amplification unit 230, comprises PMOS transistors P4 and P5 connected with a latch structure. The NMOS latch amplification unit 230, located between the PMOS latch amplification unit 210 and the pull-down switch N4, comprises NMOS transistors N2 and N3 connected with a latch structure.

The equalizing unit 220 comprises a PMOS transistor P6. The PMOS transistor P6, connected between a common gate of the PMOS transistor P4 and the NMOS transistor N2 and a common gate of the PMOS transistor P5 and the NMOS transistor N3, has a gate to receive a sense amplifier equalizing signal SEQ.

When the equalizing unit 220 is inactivated, the PMOS latch amplification unit 210 and the NMOS latch amplification unit 230 are activated. As a result, the sense amplifier S/A performs a normal operation. When the sense amplifier enable signals SEP and SEN are activated, the PMOS transistor P3 and the NMOS transistor N4 are turned on, and the PMOS latch amplification unit 210 and the NMOS latch amplification unit 230 operate. Here, the equalizing signal SEQ becomes at a high level, and the PMOS transistor P6 is kept turned off.

On the other hand, when the equalizing unit 220 is activated, the sense amplifier S/A is inactivated. That is, if the equalizing signal SEQ transits to a low level, the PMOS transistor P6 is turned on to pull down and equalize an amplification node of the sense amplifier S/A.

A common data bus pull-up driver 240 comprises a PMOS transistor P2. The PMOS transistor P2, connected between the power voltage VCC terminal and the common data bus CDB, has a gate to receive a common data bus pull-up signal CDBPU. The common data bus pull-up driver 240 is turned on in a precharge mode to precharge the common data bus CDB to a power voltage level.

A common data bus switching unit 250 selectively supplies a common data bus selecting signal CDB_SW for controlling a sensing voltage of a node/S into the common data bus CDB. Here, the common data bus switching unit 250 is disconnected in a restore mode. A reference voltage controller 260 controls a reference voltage selecting signal REF_SW for selectively supplying a reference voltage REF to a node S. when the sense amplifier S/A performs a sense operation, the reference voltage controller 260 is turned on to supply the reference voltage to the node S.

A write driving switching unit 270, connected between a node G and the data bus unit 400, drives write data applied from the data bus unit 400, and outputs the driven write data into the node/S. A read driving switching unit 280, connected between the common data bus CDB and the node G, drives read data applied from the node G, and outputs the driven read data into the common data bus CDB. The read driving switching unit 280 restores data applied from the sense amplifier S/A through a column selecting switch 310.

The column selecting switch 310 controls selective connection between the node/S and the node G. The column selecting switch 311 controls selective connection between the node S and the data bus unit 400. In the write mode, the write data applied through the data bus unit 400 are stored in the sense amplifier S/A through the column selecting switch 311. In the read mode, the read data stored in the sense amplifier S/A are outputted into the data bus unit 400 through the column selecting switch 311.

Figure 23:
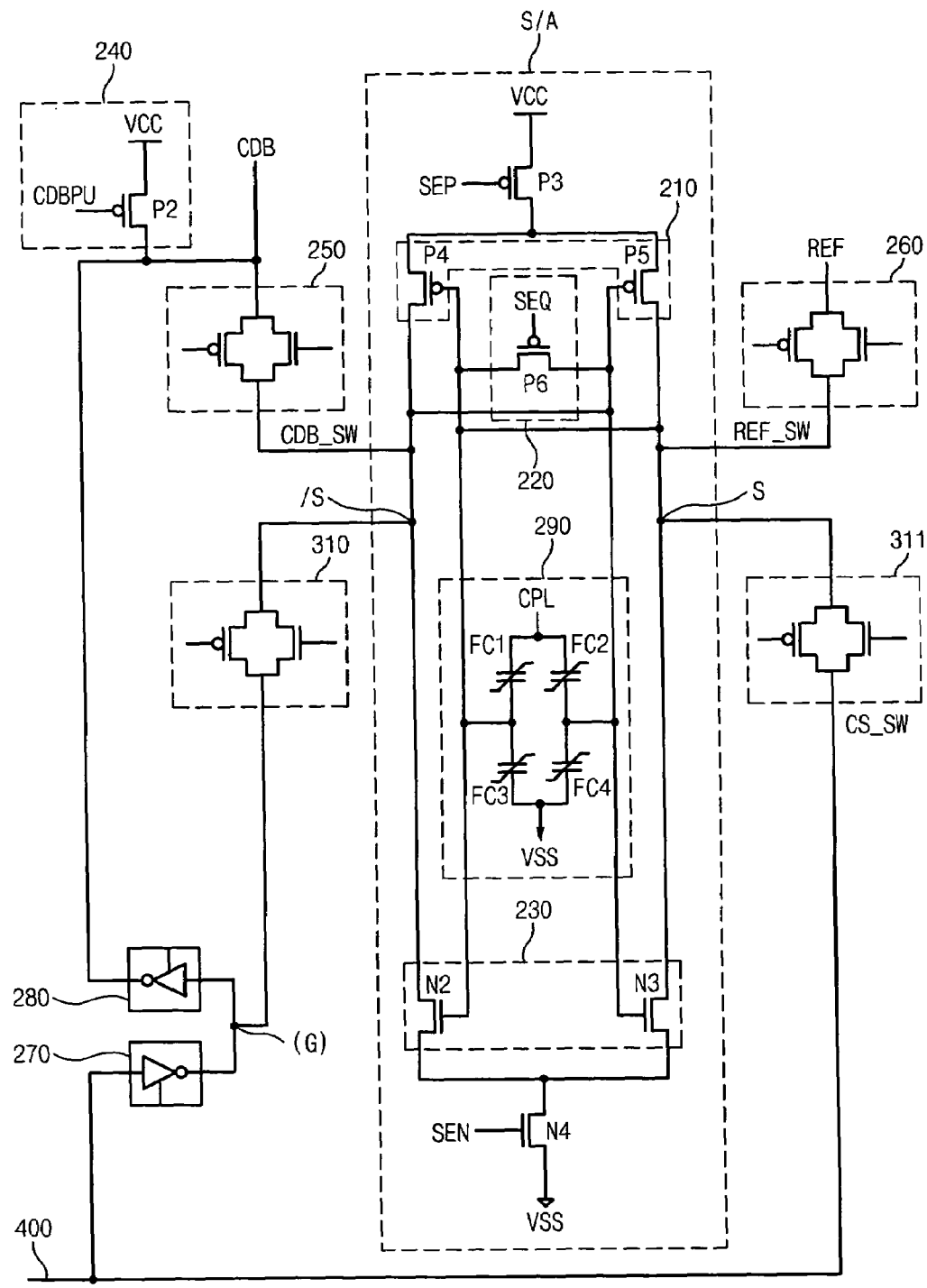

FIG. 23 is a circuit diagram illustrating another example of the sense amplifier S/A of FIG. 22.

In another embodiment, the sense amplifier S/A of FIG. 23 further comprises a ferroelectric capacitor unit 290 for storing and restoring the previous data. The ferroelectric capacitor unit 290 comprises a plurality of ferroelectric capacitors FC1~FC4.

The ferroelectric capacitor FC1 and FC2 have one terminal connected to the common gate of the PMOS transistor P4 and the NMOS transistor N2. The ferroelectric capacitor FC1 has the other terminal connected to a cell plate line CPL, and the ferroelectric capacitor FC3 has the other terminal connected to the ground voltage terminal.

The ferroelectric capacitors FC2 and FC4 have one terminal connected to the common gate terminal of the PMOS transistor P5 and the NMOS transistor N3. The ferroelectric capacitor FC2 has the other terminal connected to the cell plate line CPL, and the ferroelectric capacitor FC4 has the other terminal connected to the ground voltage terminal.

The ferroelectric capacitor unit 290 stores data when the sense amplifier S/A is inactivated, and restores the previous data when the sense amplifier S/A is activated. The rest configuration of FIG. 23 is the same as that of FIG. 22.

Figure 24:
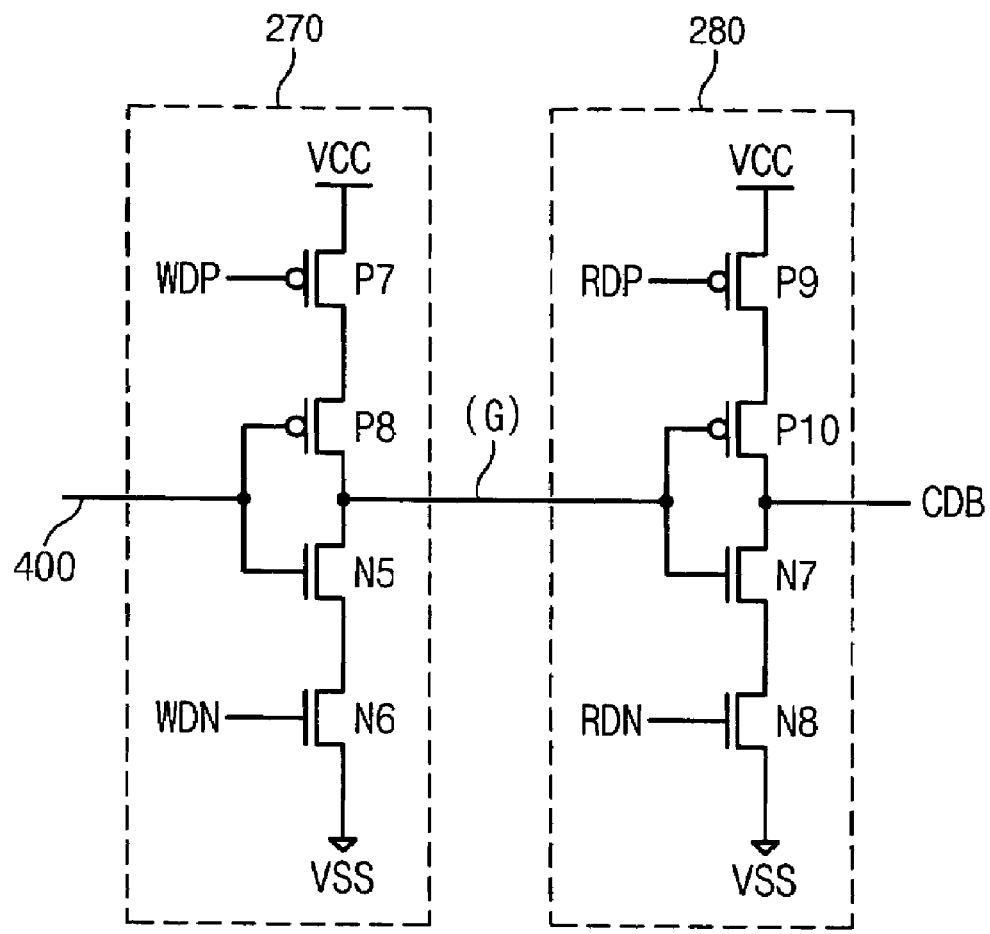
FIG. 24 is a circuit diagram of a read driving switching unit of FIG. 22 and a write driving switching unit of FIG. 23.

FIG. 24 is a circuit diagram of the read driving switching unit 270 of FIG. 22 and the write driving switching unit 280 of FIG. 23.

The write driving switching unit 270 comprises PMOS transistor P7, P8 and NMOS transistors N5 and N6 connected serially between the power voltage terminal and the ground voltage terminal. The PMOS transistor P7 has a gate to receive a write driving signal WDP. A common gate of the PMOS transistor P8 and the NMOS transistor N5 is connected to the data bus unit 400. The NMOS transistor N6 has a gate to receive a write driving signal WDN. Here, the write driving signal WDP has an opposite phase to the write driving signal WDN.

The read driving switching unit 280 comprises PMOS transistors P9, P10 and NMOS transistors N7, N8 connected serially between the power voltage terminal and the ground voltage terminal. The PMOS transistor P9 has a gate to a read driving signal RDP. The PMOS transistor P10 and the NMOS transistor N7 have a common gate connected to the node G, and a common drain connected to the common data bus CDB. The NMOS transistor N8 has a gate to receive a read driving signal RDN. The read driving signal RDP has an opposite phase to the read driving signal RDN.

Figure 25:
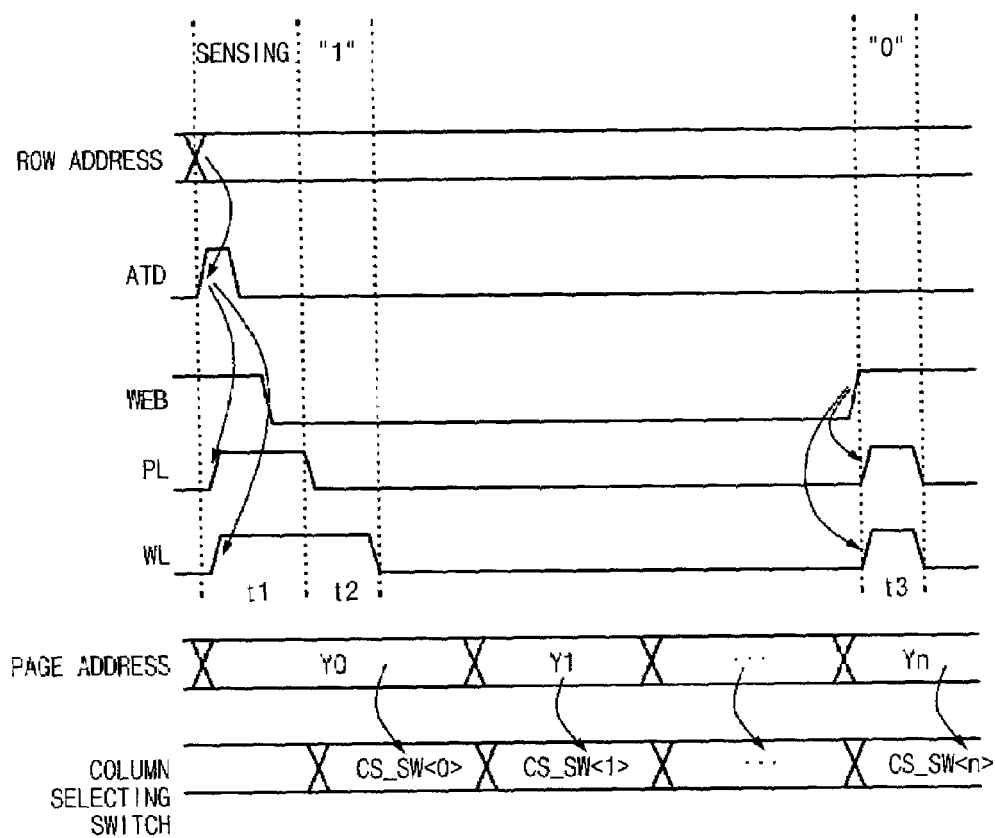
FIGS. 25 to 27 are timing diagrams illustrating the operation of sense amplifiers of FIGS. 22 and 23.

FIG. 25 is a timing diagram illustrating the operation of the sense amplifiers S/A of FIGS. 22 and 23.

If a new row address is inputted, the address transition detecting signal ATD is enabled. As a result, the plateline PL and the wordline WL are enabled to activate the cell driving. In an interval T2, data "1" is sensed as the write enable signal WEB is inactivated.

The column selecting signals CS_SW<n:0> are sequentially activated by page addresses Y<n:0>. When the write enable signal WEB is enabled, the plateline PL and the wordline WL are activated to write data "0" in an interval T3.

Figure 26:
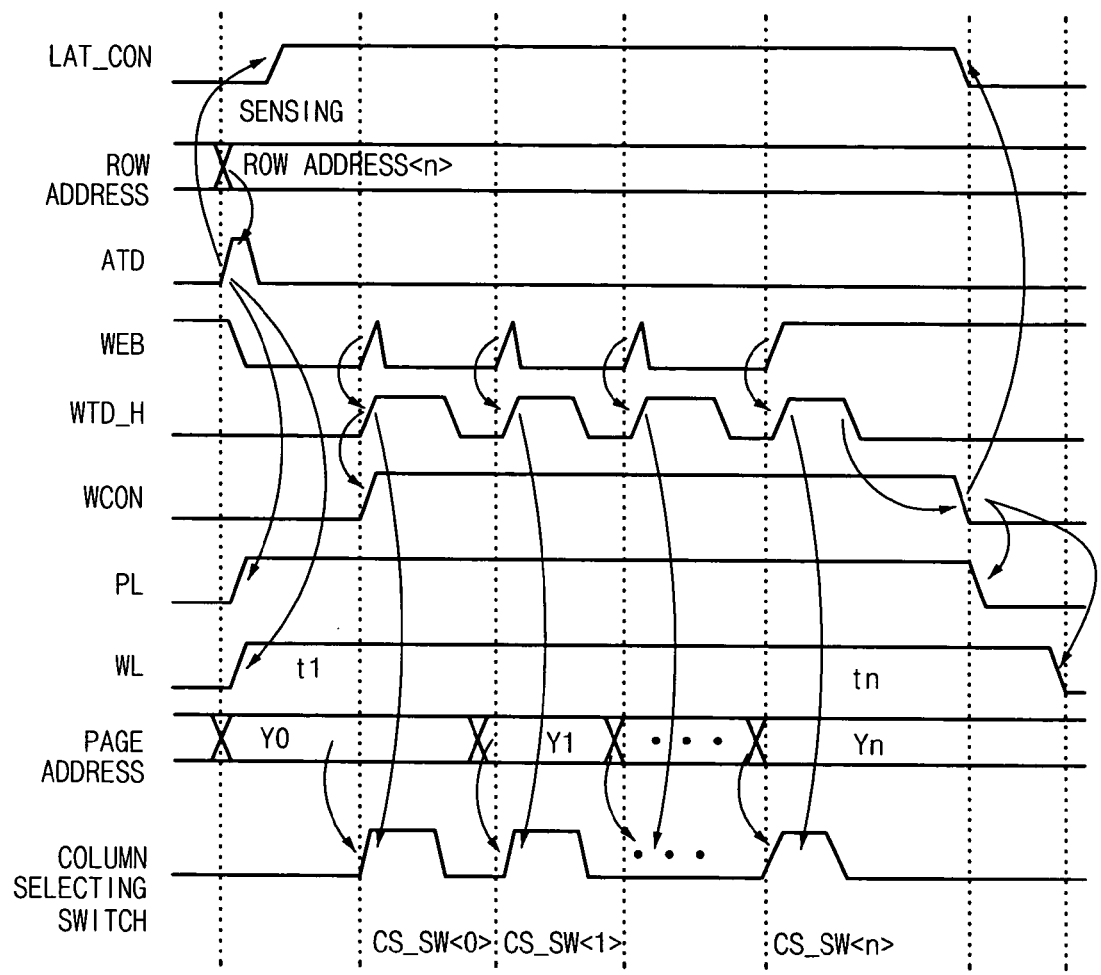

FIG. 26 is a timing diagram illustrating the operation of the sense amplifier S/A applied to the example of FIG. 19.

If a new row address is inputted, the address transition detecting signal ATD is enabled and the write enable signal WEB is disabled. As a result, the plateline PL and the wordlin WL are enabled, thereby activating cell driving. Here, the plateline PL is maintained at a high level during the interval T1. IF the latch control signal LAT_CON is enabled to the high level in response to the address transition detecting signal ATD, the previously inputted row address is latched in the latch controller 42.

Thereafter, a write enable transition detecting signal WTD_H (activated at a high level) is enabled depending on toggle of the write enable signal WEB. A write control signal WCON is activated in response to the write enable transition detecting signal WTD_H. When the write enable transition detecting signal WTD_H is activated, the column selecting signals CS_SW<n:0> are sequentially activated by the page addresses Y<n:0>.

In an interval Tn, the write enable signal WEB is enabled, and the write control signal WCON and the plateline PL are disabled when the write enable transition detecting signal WTD_H. The latch control signal LAT_CON is disabled as the write control signal WCON for controlling the disable state of the latch control signal LAT_CON is disabled. If a predetermined time passes after the plateline PL is disabled, the wordline WL is disabled.

Figure 27:
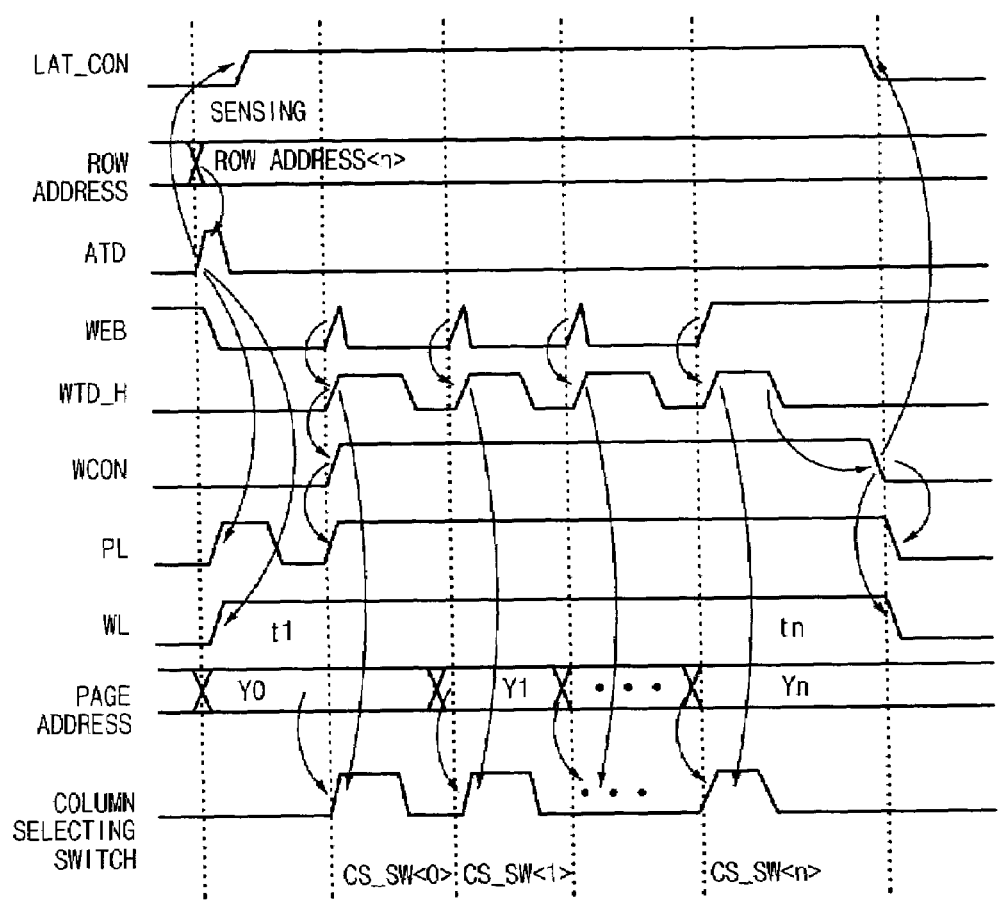

FIG. 27 is a timing diagram illustrating the operation of the sense amplifier S/A applied to the example of FIG. 20.

If a new row address is inputted, the address transition detecting signal ATD is enabled, and the write enable signal WEB is disabled. As a result, the plate signal PL and the wordline WL are enabled, thereby activating cell driving. After enabled for a predetermined time, the plateline PL is kept disabled before the write control signal WCON is activated. If the latch control signal LAT_CON is enabled to the high level by the address transition detecting signal ATD and the plateline PL is enabled to the high level, the previously inputted row address is latched in the latch controller 42.

Then, the write enable transition detecting signal WTD_H (activated at the high level) is enabled depending on toggle of the write enable signal WEB. The write control signal WCON is activated in response to the write enable transition detecting signal WTD_H. When the write enable transition detecting signal WTD_H is activated, the column selecting signals CS_SW<n:0> are sequentially activated by the page addresses Y<n:0>.

In the interval Tn, the write enable signal WEB is enabled, and the write control signal WCON, the plateline PL and the wordline WL are disabled when the write enable transition detecting signal WTD_H is disabled. The latch control signal LAT_CON is disabled as the write control signal WCON for controlling the disable state of the latch control signal LAT_CON is disabled.

Figure 28:
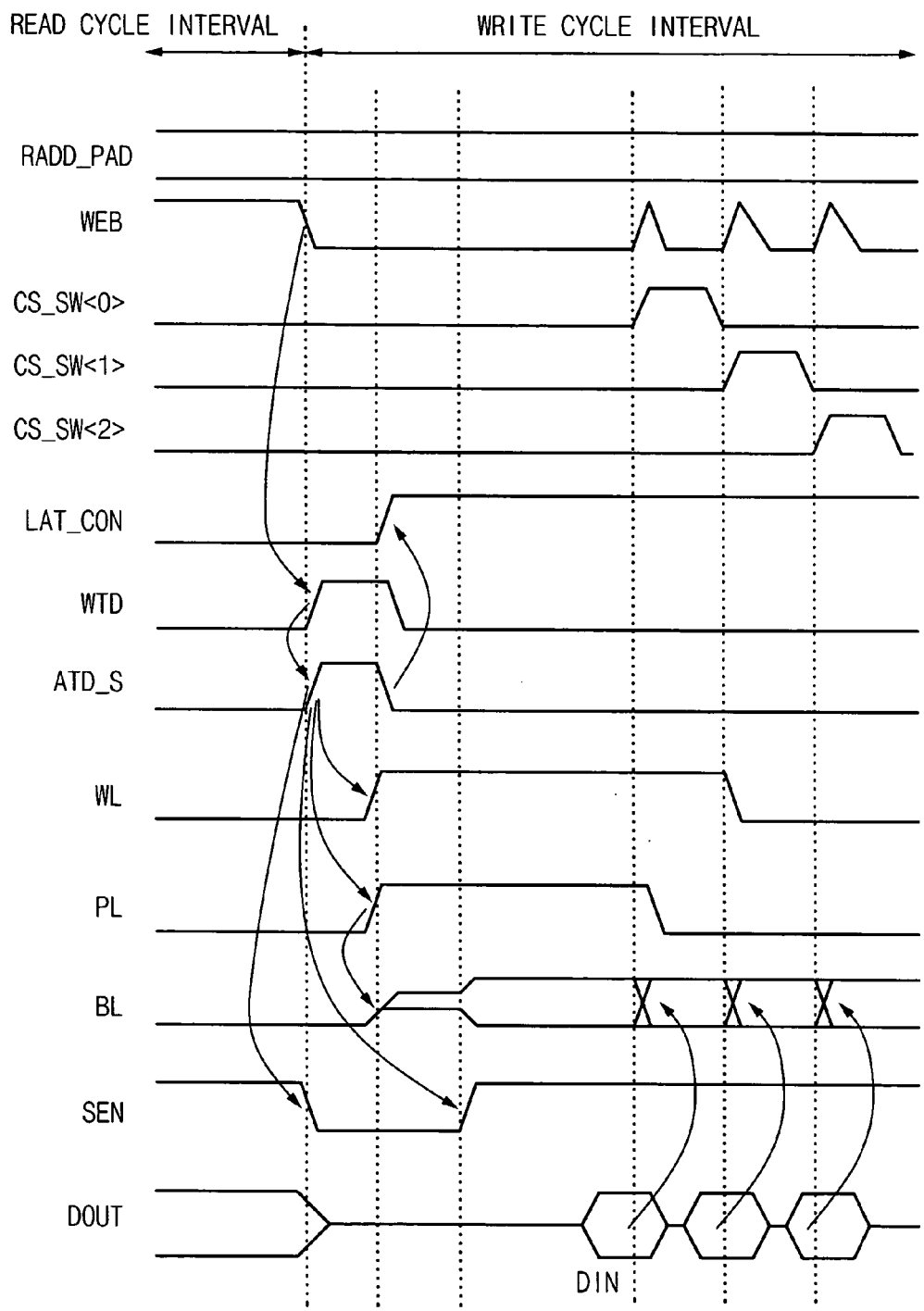
FIG. 28 is a timing diagram illustrating the operation of the nonvolatile ferroelectric memory according to an embodiment of the present invention.

FIG. 28 is a timing diagram illustrating the operation of the write enable transition detecting signal WTD depending on activation of the write enable signal WEB.

In the read mode, the output data DOUT are outputted because the write enable signal WEB and the sense amplifier enable signal SEN are maintained at the high level in the same the row address RADD_PAD.

In the write mode, the write enable signal WEB transits to a low level in the same row address RADD_PAD. As a result, the writ enable transition detecting signal WTD is generated. Then, the transition synthesizing signal ATD_S is enabled by the writ enable transition detecting signal WTD. The output data DOUT is no longer outputted as the sense amplifier enable signal SEN is disabled to the low level.

Thereafter, if the transition synthesizing signal ATD_S is disabled, the latch control signal LAT_CON is enabled to the high level, and the wordline WL, the platelins PL and the bitline BL are enabled to the high level.

Then, if the write enable signal WEB toggles, the column selecting signals CS_SW<0>, CS_SW<1> and CS_SW<2> are sequentially enabled synchronously with respect to the write enable signal WEB. When the sense amplifier enable signal SEN is activated, a plurality of input data DIN is sequentially written in a corresponding cell by the chip control signal generator 100. As a result, the normal write operation can be performed.

The sense amplifier S/A is kept active to continuously store data inputted in the previous address cycle before the write enable transition detecting signal WTD is generated.

Figure 29:
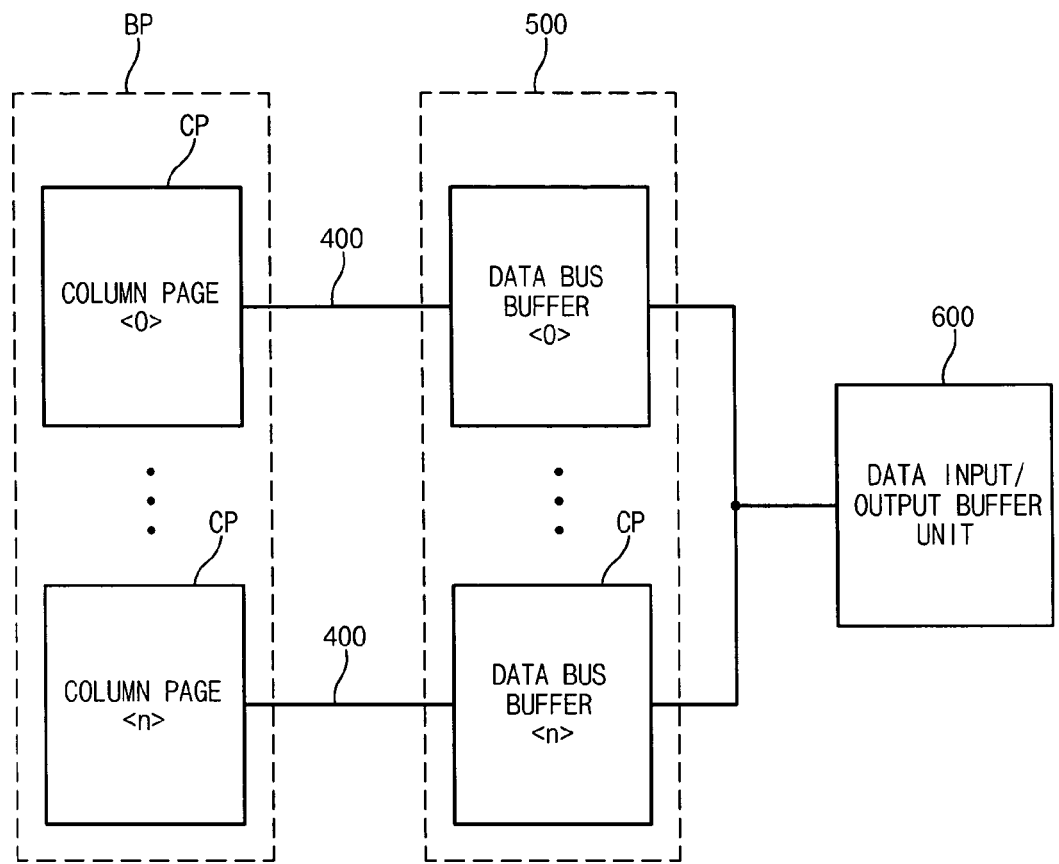
FIG. 29 is a structural diagram of a data bus buffer unit of the nonvolatile ferroelectric memory according to an embodiment of the present invention.

FIG. 29 is a structural diagram of a data bus buffer unit 500 connected to the block page BP of FIG. 20.

The data bus buffer unit 500 comprises a plurality of data bus buffers<0:n>. The plurality of data bus buffers <0:n> are connected one by one to the data bus units 400. Thus, data outputted from the plurality of column pages CP are buffered through the data bus buffer unit 500, and outputted into a data input/output buffer unit 600. Data inputted from the data input/output buffer unit 600 are buffered through the data bus buffer unit 500, and outputted into the block page BP.

Figure 30:
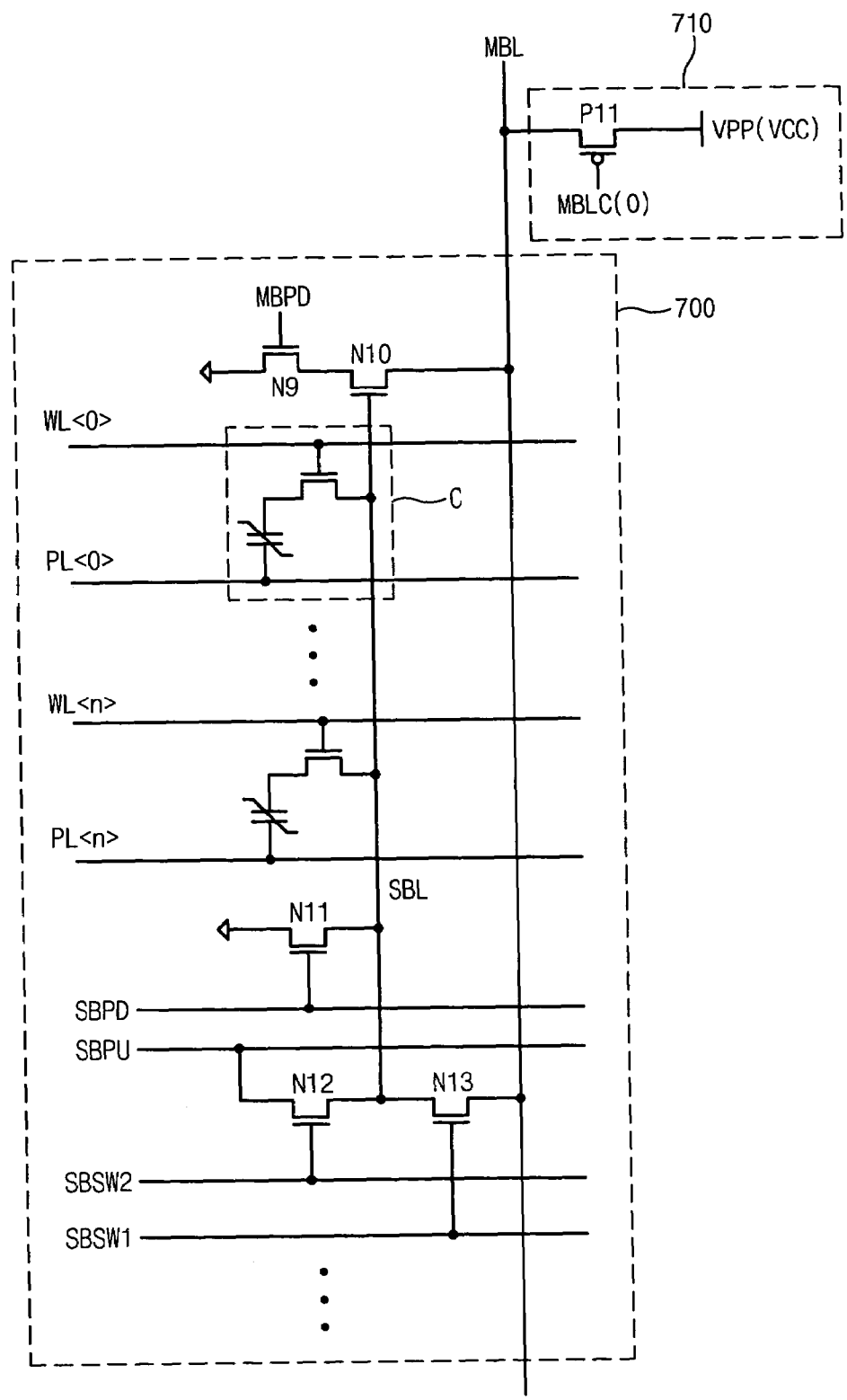
FIG. 30 is a circuit diagram of a cell array of the nonvolatile ferroelectric memory according to an embodiment of the present invention.

FIG. 30 is a circuit diagram of a cell array of FIG. 20.

The cell array comprises a sub cell array 700 and a main bitline load controller 710.

Each main bitline MBL of the sub cell array 700 is selectively connected to one of a plurality of sub bitlines SBL. The main bitline MBL is connected to the chip selector. When a sub bitline selecting signal SBSW1 is activated, an NMOS transistor N13 is turned on to activate one sub bitline SBL. One sub bitline SBL is connected to a plurality of cells C.

When a sub bitline pull-down signal SBPD is activated, the sub bitline SBL is pulled down to a ground level depending on turn-on of an NMOS transistor N11. A sub bitline pull-up signal SBPU to control power supplied to the sub bitline SBL generates a voltage higher than the power voltage VCC, and outputs the voltage into the sub bitline SBL.

A sub bitline selecting signal SBSW2 controls connection between a sub bitline pull-up signal SBPU terminal and the sub bitline SBL depending on switching of an NMOS transistor N12.

An NMOS transistor N10, connected between an NMOS transistor N9 and the main bitline MBL, has a gate connected to the sub bitline SBL. The NMOS transistor N9, connected between the ground voltage terminal and the NMOS transistor N10, has a gate to receive a main bitline pull-down signal MBPD, thereby regulating a sensing voltage of the main bitline MBL.

The main bitline load controller 710 comprises a PMOS transistor P11. The PMOS transistor P11, connected between a pumping voltage VPP (or power voltage VCC) terminal and the main bitline MBL, has a gate to receive a main bitline control signal MBLC. Here, the PMOS transistor P11 serves as load of the main bitline MBL in response to the main bitline control signal MBLC.

Figure 31:
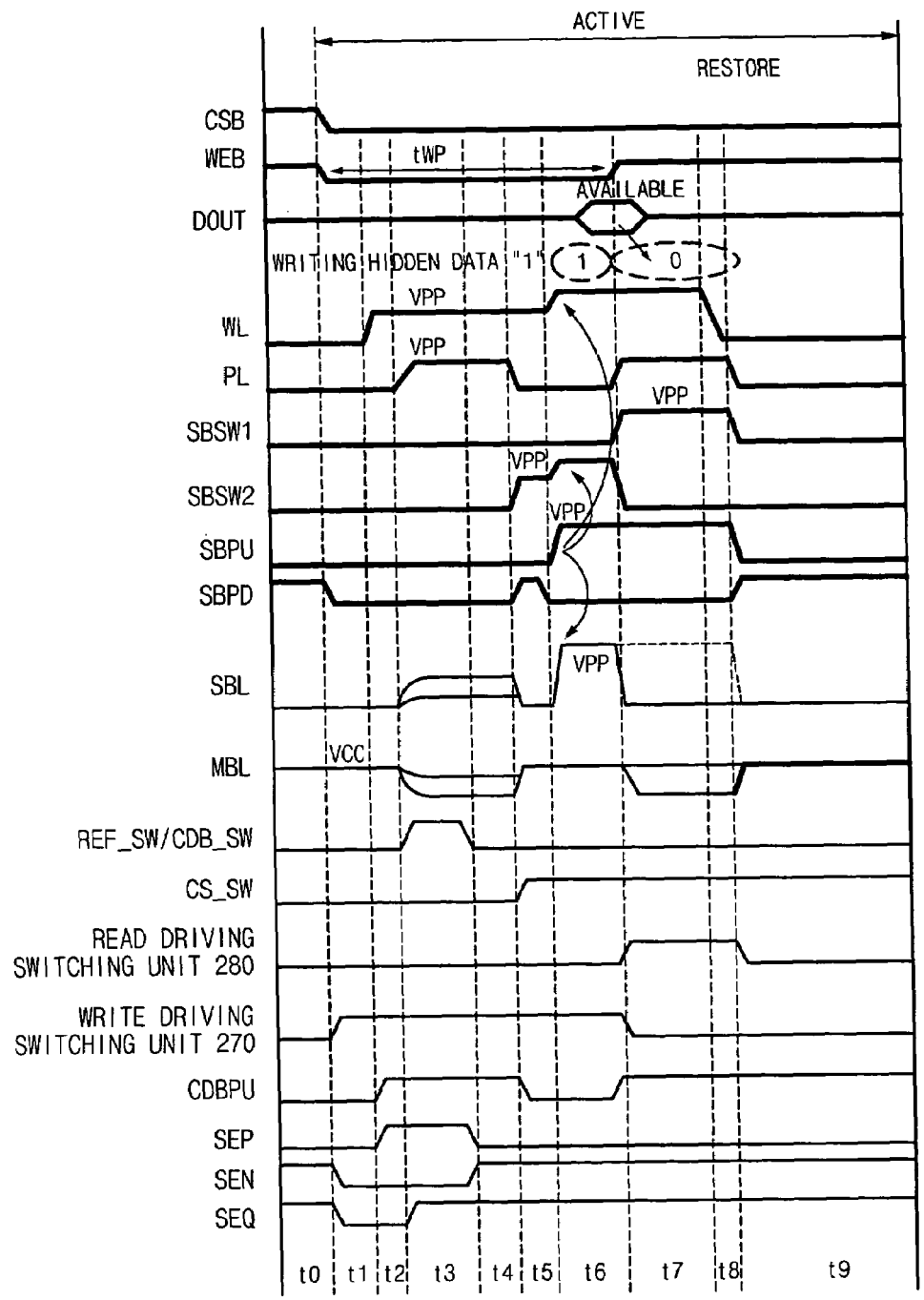
FIGS. 31 and 32 are timing diagrams of the nonvolatile ferroelectric memory according to an embodiment of the present invention.

FIG. 31 is a timing diagram illustrating the write mode of the nonvolatile ferroelectric memory according to an embodiment of the present invention.

When an interval t1 starts, a chip selecting signal CSB and the write enable signal WEB are disabled to a low level, the nonvolatile ferroelectric memory becomes at a write mode active state. As a result, the write driving switching unit 270 is enabled, and the sense amplifier enable signal SEN and the equalizing signal SEQ are disabled.

When an interval t2 starts, the wordline WL is enabled and the sub bitline pull-down signal SBPD is disabled to a low level. As a result, a storage node of the cell is initialized at a ground level. Then, a common data bus pull-up signal CDBPU and the sense amplifier enable signal SEP are enabled. In the interval t2, the wordline WL is activated earlier than the plateline PL. Thus, if the storage node of the cell is stabilized in an initial operation, sensing margin can be improved.

When an interval t3, a data sensing interval, starts, the plateline PL is enabled to the pumping voltage VPP level, and cell data are applied to the main bitline MBL. Then, the sub bitline pull-down signal SBPD is disabled, and the reference voltage selecting signal REF_SW and the common data bus selecting signal CDB_SW are enabled. Here, the equalizing signal SEQ is enabled to a high level, thereby inactivating the equalizing unit 220. As a result, the sense amplifier S/A is activated.

When an interval t4 starts, the sense amplifier enable signal SEP, the reference voltage selecting signal REF_SW and the common data bus selecting signal CDB_SW are disabled. Then, the sense amplifier enable signal SEN is enabled to activate the sense amplifier S/A.

When an interval t5 starts, the plateline PL is disabled, and the sub bitline selecting signal SBSW2 is enabled to the pumping voltage VPP level. Then, the sub bitline pull-down signal SBPD is enabled to a high level, and the sub bitline SBL becomes at the ground level. The main bitline MBL and the column selecting signal CS_SW are enabled, and the common data bus pull-up signal CDBPU is disabled.

When an interval t6 starts, the voltage level of the wordline WL rises, and cell data "high" is written. The sub bitline pull-up signal SBPU is enabled to a high level, and the voltage level of the sub bitline selecting signal SBSW2 rises. As a result, the sub bitline SBL rises to the pumping voltage VPP level, and the sub byline pull-down signal SBPD is disabled to a low level.

When an interval t7 starts, if the write enable signal WEB and the plateline PL are enabled, cell data "0" is restored during a data available interval. Here, the main bitline MBL is disabled to a low level. The sub bitline selecting signal SBSW1 rises to the pumping voltage VPP level, and the sub bitline selecting signal SBSW2 is disabled to a low level. As a result, data of the main bitline MBL are outputted into the sub bitline SBL. Here, the read driving switching unit 280 and the common data bus pull-up signal CDBPU are enabled, and the write driving switching unit 270 is disabled.

When data of the cell is "high", the voltage of the sub bitline SBL is at a high level in a sensing mode. Thus, current of the switching transistor in the cell C becomes larger, and the voltage of the main bitline MBL induced from cell data "low" becomes lower.

On the other hand, when data of the cell is "low", the voltage of the sub bitline SBL becomes at a low level in the read mode. Thus, current of the switching transistor in the cell C becomes smaller, and the voltage of the main bitline MBL induced from cell data "high" becomes higher.

Next, when an interval t8 starts, the wordline WL is disabled earlier than the plateline PL.

When an interval t9 starts, the plateline PL, the sub bitline selecting signal SBSW1, the sub bitline pull-up signal SBPU and the read switching unit 280 are disabled to the low level. The sub bitline pull-down signal SBPD and the main bitline MBL are enabled to the high level.

Figure 32:
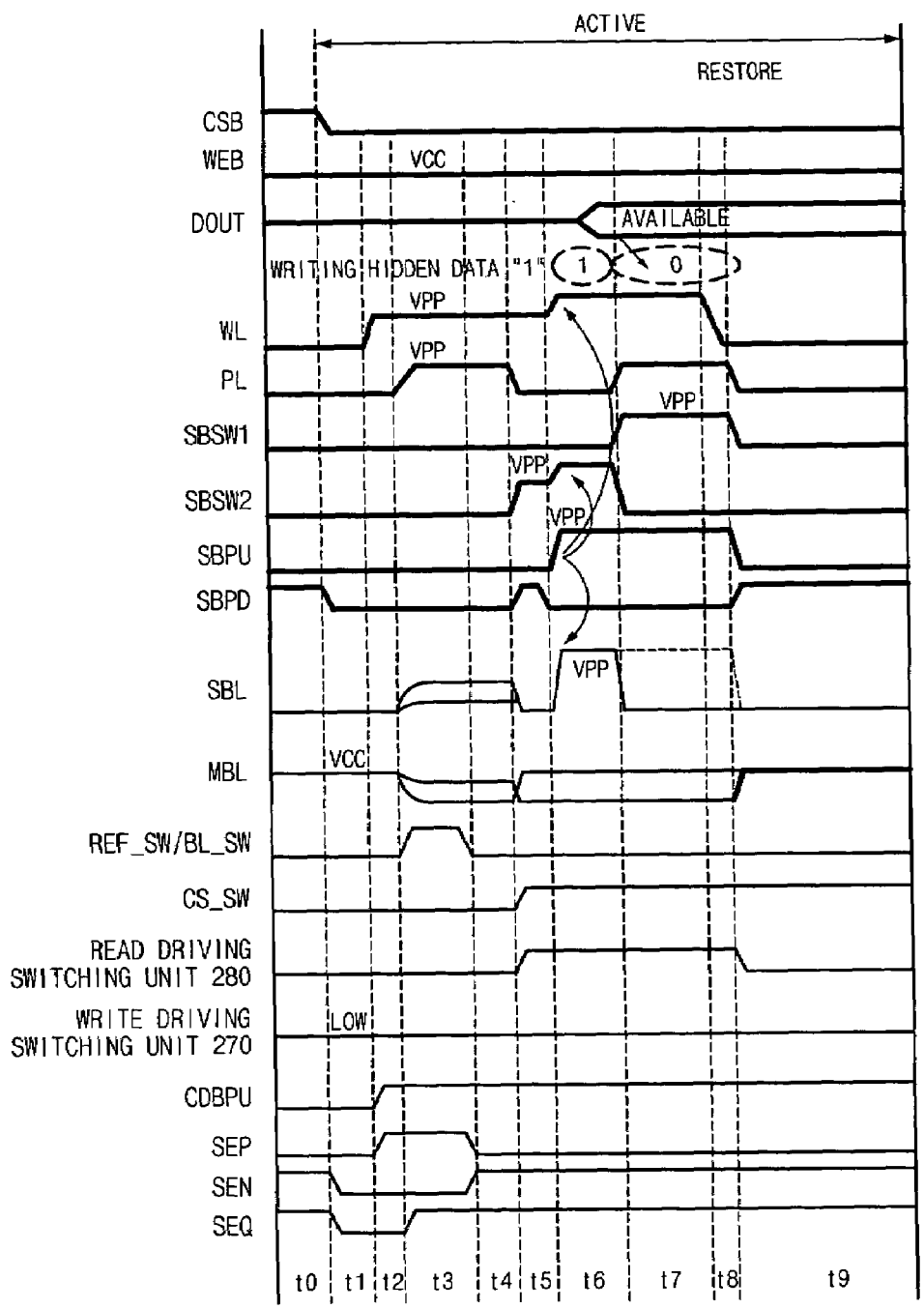

FIG. 32 is a timing diagram illustrating the read mode of the nonvolatile ferroelectric memory according to an embodiment of the present invention.

In the read mode, the write enable signal WEB is maintained at the power voltage level, and the write driving switching unit 280 is maintained at a low level. When an interval t2 starts, the common data bus pull-up signal CDBPU is continuously maintained at the high level. Thereafter, when the interval 5 starts, the read driving switching unit 280 is activated, and kept active before an interval t9. After an interval t6, a data output available interval is continuously maintained.

Figure 33:
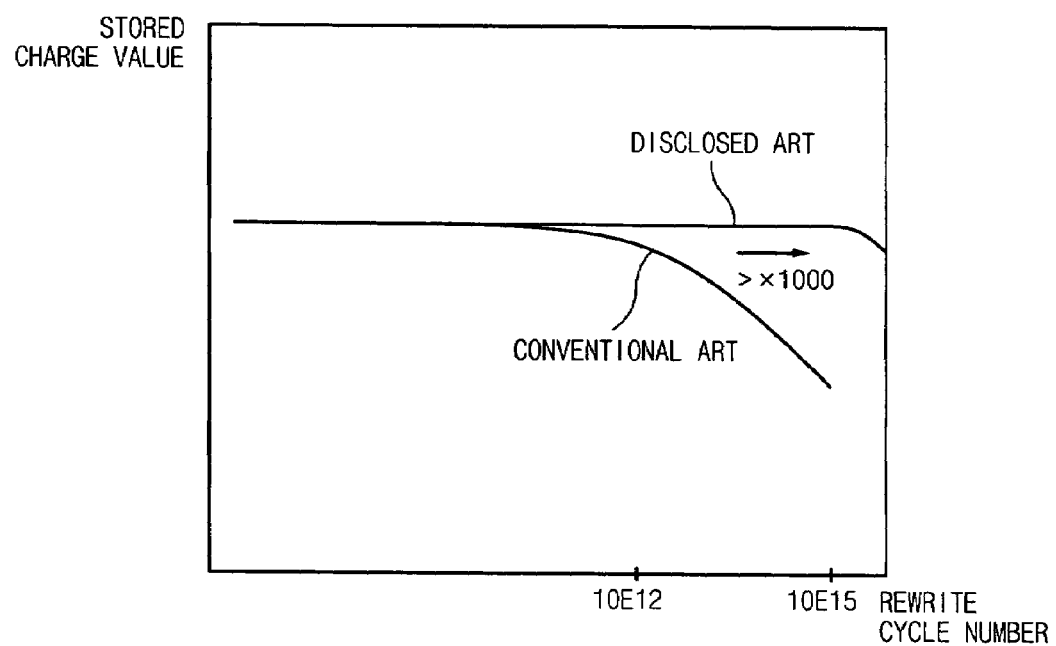
FIGS. 33 and 34 are graphs illustrating the relationship between the number of rewrite operations and power consumption.

FIG. 33 shows the number of rewrite operations according to an embodiment of the present invention.

As shown in FIG. 30, the cell access operation is performed in every cycle of the conventional nonvolatile ferroelectric memory. As a result, repetitive write stress to perform read/write operations is given by the destructive operation of the memory cell.

In a general ferroelectric capacitor, if the write operation is repeated, charge storage capacity is degraded. When the write operation is repeated over predetermined times (10E12), the charge storage capacity is continuously decreased, which results in degradation.

However, since the nonvolatile ferroelectric memory according to an embodiment of the present invention comprises a page buffer region, data can be immediately accessed in a page buffer without performing the cell access operation. As a result, the number of the repetitive write operation is reduced since the cell is not driven in an access within a page.

As shown in FIG. 33, when the page buffer comprises 1000 page addresses, the number of rewrite cycles of a chip is reduced by 1000 times. Therefore, when compared to the conventional art, the number (10E15) of repetitive write operations can be enlarged.

Figure 34:
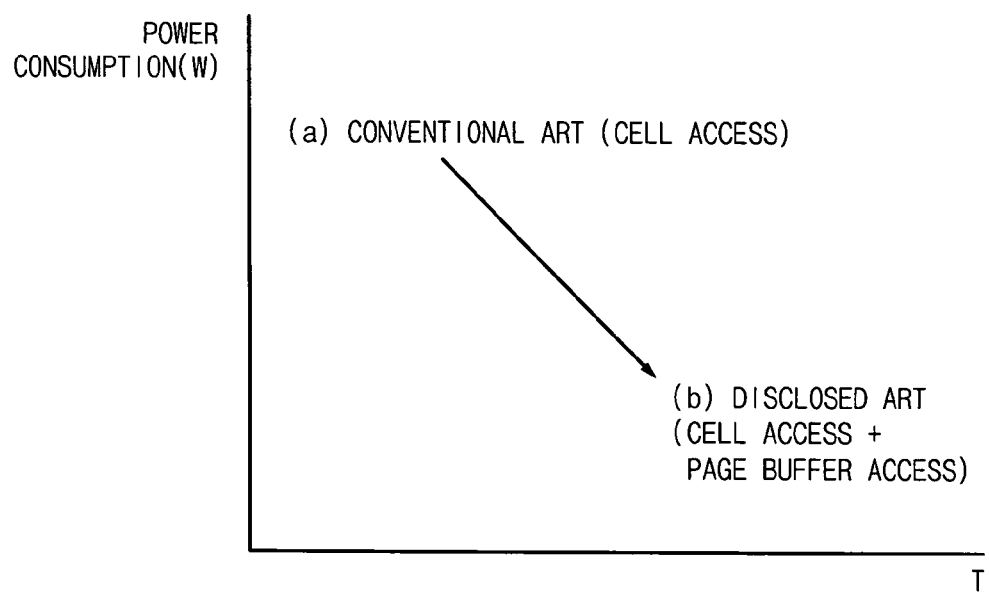

FIG. 34 shows power consumption according to an embodiment of the present invention.

In the conventional art, large power consumption is required because all circuits related to chip driving such as the wordline WL and the plateline PL perform their operations in response to the address transition detecting signal ATD.

However, in an embodiment of the present invention, power consumption is reduced because only a decoder and data input/output buffers related to partial page addresses operate when the page buffer is accessed.

As described above, a nonvolatile ferroelectric memory according to an embodiment of the present invention immediately outputs data stored in a page buffer without performing a cell access operation when a page buffer is accessed, thereby minimizing power consumption and improving reliability of the cell. Additionally, since the address assignment structure is divided into a row address region and a page address region, the number of cell operations is reduced, thereby minimizing power consumption. As a result, the life span of battery can be extended when the nonvolatile ferroelectric memory is applied to mobile products.

What is claimed is:

1. A nonvolatile ferroelectric memory control device comprising:
    a page address buffer for latching a page address having a block page address region and a column page address region in response to a chip enable signal, and for decoding the latched page address;
    a row address latch unit for latching a row address in response to the chip enable signal, and for outputting the latched row address;
    an address transition detector for detecting transition of the latched row address, and for outputting an address transition detecting signal;
    a reset signal transition detector for detecting transition of a reset signal in response to the chip enable signal, and for outputting a reset transition detecting signal;
    a write enable signal transition detector for detecting transition of a write enable signal in response to the chip enable signal, and for outputting a write enable transition detecting signal;
    a synthesizer for outputting a transition synthesizing signal in response to the address transition detecting signal, the reset transition detecting signal and the write enable transition detecting signal; and
    a chip control signal generator for selectively generating a control signal to control a chip operation in response to the transition synthesizing signal.

2. The device according to claim 1, wherein the row address is arranged in more significant bit region, a column page address of the page address is arranged in less significant bit region, and a block page address of the page address is arranged between the row address region and the column page address region.

3. The device according to claim 1, wherein the page address buffer comprises:
    a page address latch unit for latching a page address in response to the chip enable signal, and for outputting the latched page address; and
    a page decoder for decoding the latched page address.

4. The device according to claim 3, wherein the page address latch unit comprises:
    a page address controller for latching the page address in response to the chip enable signal, and for selectively outputting the latched page address; and
    a first output means for delaying an output signal from the page address controller, and for outputting the latched page address.

5. The device according to claim 1, wherein the row address latch unit comprises:
    a row address controller for latching the row address in response to the chip enable signal, and for selectively outputting the latched row address;
    a latch controller for latching an output signal from the row address controller in response to a latch control signal, and for selectively outputting the latched output signal; and
    a second output means for delaying an output signal from the latch controller, and for outputting the latched row address.

6. The device according to claim 1, wherein the reset signal transition detector comprises:
    a reset signal detector for latching a high voltage level while the chip enable signal is disabled before the reset signal transits to a low level in an initial stage of the memory cell operation; and
    a pulse generator for generating the reset transition detecting signal having a pulse width for a predetermined delay time depending on the high voltage level.

7. The device according to claim 6, wherein the reset signal detector comprises:
    an input controller for detecting transition of the reset signal and the chip enable signal;
    a driver, driven in response to an output signal from the input controller, for selectively outputting a power voltage or a ground voltage; and
    a latch unit for latching an output signal from the driver for a predetermined time.

8. The device according to claim 6, wherein the pulse generator comprises:
    a delay unit for delaying an output signal from the reset signal detector for a predetermined time; and
    a logic unit for performing a logic operation on output signals from the reset signal detector and the delay unit, and generating the reset transition detecting signal.

* * * * *